United States Patent
Ishii et al.

(10) Patent No.: US 6,787,369 B2
(45) Date of Patent: Sep. 7, 2004

(54) METHOD FOR MANUFACTURING A MAGNETO-RESISTIVE EFFECT ELEMENT AND A METHOD FOR MANUFACTURING A MAGNETO-RESISTIVE EFFECT TYPE MAGNETIC HEAD

(75) Inventors: Satoru Ishii, Tokyo (JP); Satoshi Sasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/181,759

(22) PCT Filed: Nov. 22, 2001

(86) PCT No.: PCT/JP01/10210
§ 371 (c)(1),
(2), (4) Date: Feb. 19, 2003

(87) PCT Pub. No.: WO02/43164
PCT Pub. Date: May 30, 2002

(65) Prior Publication Data
US 2003/0162344 A1 Aug. 28, 2003

(30) Foreign Application Priority Data

Nov. 22, 2000 (JP) ......................................... 2000-356255

(51) Int. Cl.⁷ .............................................. H01L 21/00
(52) U.S. Cl. ............................................................ 438/3

(56) References Cited

U.S. PATENT DOCUMENTS

| | | | | |
|---|---|---|---|---|
| 5,099,376 A | * | 3/1992 | Ino et al. | 360/120 |
| 5,768,072 A | * | 6/1998 | Ueta et al. | 360/126 |
| 6,172,859 B1 | * | 1/2001 | Watanabe et al. | 360/327.3 |
| 6,532,823 B1 | * | 3/2003 | Knapp et al. | 73/779 |
| 6,545,848 B1 | * | 4/2003 | Terunuma | 360/324.12 |
| 6,576,969 B2 | * | 6/2003 | Tran et al. | 257/421 |

FOREIGN PATENT DOCUMENTS

| | | |
|---|---|---|
| JP | 10-163545 | 6/1998 |
| JP | 10-275310 | 10/1998 |
| JP | 10-321919 | 12/1998 |
| JP | 11-232618 | 8/1999 |
| JP | 2001-102658 | 4/2001 |
| WO | WO 97/44781 | 11/1997 |

* cited by examiner

Primary Examiner—David Nelms
Assistant Examiner—Thao P. Le
(74) Attorney, Agent, or Firm—Sonnenschein, Nath & Rosenthal LLP

(57) ABSTRACT

There is provided an MR manufacturing method comprising a film-forming process for forming a multilayer film including at least an antiferromagnetic layer 4, a fixed layer 3 and a spacer layer 5, a first patterning process for patterning the multilayer film after a predetermined pattern, a filing process for filling up the circumference of the patterned multilayer film, with an insulating layer 13 a process for forming a magnetic flux guide layer or a free layer also acting as the magnetic flux guide layer over this insulating layer 13 and the patterned multilayer film and a second patterning process by beam etching for simultaneously patterning the magnetic flux guide layer and the above-mentioned multilayer film to form the above-mentioned multilayer structure portion, wherein an incident angle of the etching beam are selected so that an angle θ of an etching surface relative to a normal is selected in a range of from $10° \leq \theta \leq 40°$, preferably, $15° \leq \theta \leq 35°$. Thus, etch rates of the materials composing the multilayer structure portion and materials compoising the insulating layer become nearly equal, whereby etchings at the respective portions can be achieved satisfactorily with high accuracy. As a result, characteristics of the magneto-resistive effect element and the magneto-resistive effect type magnetic head can be stabilized, and the yield thereof can be improved.

6 Claims, 16 Drawing Sheets

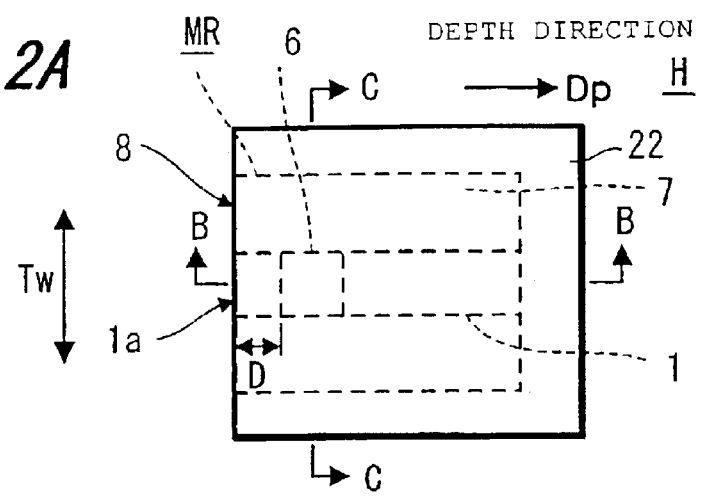
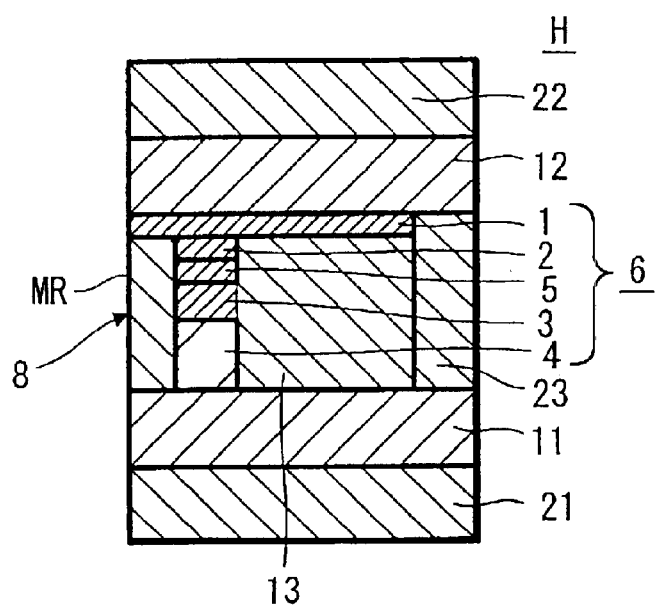
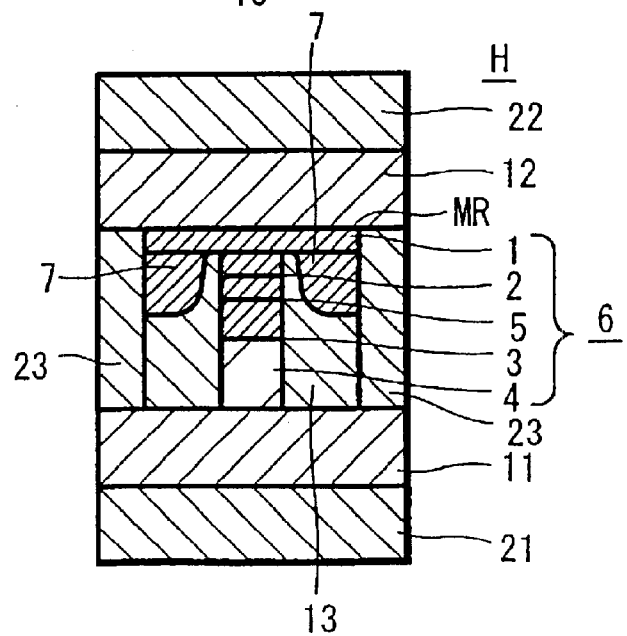

METHOD FOR MANUFACTURING A MAGNETO-RESISTIVE EFFECT ELEMENT AND A METHOD FOR MANUFACTURING A MAGNETO-RESISTIVE EFFECT TYPE MAGNETIC HEAD

TECHNICAL FIELD

The present invention relates to a method of manufacturing a magneto-resistive effect element and a method of manufacturing a magneto-resistive effect type magnetic head.

BACKGROUND ART

In recent years, a recording density is progressively increased in the field of the magnetic recording and magneto-resistive effect type magnetic heads (MR type magnetic heads) using a giant magneto-resistive effect (GMR) element as a magnetic sensing portion are now put into practical use. Lately, those magneto-resistive effect type magnetic heads have achieved a recording density in excess of 50 Gb/inch$^2$ (e.g., Intermag Conference 2000: Fujitsu, Read-Rite).

In such magnetic head, the MR element portion has a so-called CIP (Current In-Plane) type structure capable of detecting a magnetic field by an electrical resistance change occurring when a sense current is usually conducted in a film plane direction and an external magnetic field, i.e., a signal magnetic field corresponding to recorded information from a magnetic recording medium is applied to the film plane in parallel thereto.

On the other hand, with the increasing demand for a higher recording density, it has been requested that the elements are microminiaturized by selecting materials composing the MR element portion which can realize a high sensitivity and by using a high-precise patterning, to be specific, a photolithography technique which can reduce a track width.

In contrast, as a magneto-resistive element which can exhibit a larger resistance change, there has been proposed based on a CPP (Current Perpendicular to Plane) type structure a spin valve type MR (SV type GMR) element or a tunnel type MR (TMR) element in which a sense current is conducted in the direction perpendicular to the film plane of the MR element.

Of the MR element of this CPP type structure, the SV type GMR element can be realized by a film structure substantially similar to that of the conventional CIP type. Specifically, this magneto-resistive effect element includes two ferromagnetic layers separated by a spacer layer formed of a thin nonmagnetic conductive layer and makes use of a resistance change based upon an electron spin dependent scattering caused on these interfaces.

In this case, one of the ferromagnetic layers is made of a material whose saturation coercive force is larger than that of the other ferromagnetic layer, and so has a high saturation magnetic field.

Further, in this structure, the film thicknesses of the respective layers are optimized depending on mean free paths of electrons in the respective layers so that the amount of the resistance change may be increased.

The magnetic response of this MR element is a function depending upon a relative magnetization direction between the two ferromagnetic layers.

On the other hand, the TMR type element includes two ferromagnetic layers separated by a spacer comprised of a thin insulating tunnel barrier layer and makes use of a resistance change caused by a magnetic polarization electron tunnel phenomenon.

One of these ferromagnetic layers has typically a saturation magnetic field which is higher than that of the other ferromagnetic layer in one direction.

Then, its insulating tunnel barrier layer has a film thickness which is thin enough to make a quantum mechanics tunnel phenomenon occur between the two ferromagnetic layers. This tunnel phenomenon depends upon an electron spin, whereby a magnetic response of a tunnel type element depends upon a relative magnetization direction of the above-described two ferromagnetic layers and a function of a spin polarity.

Because the SV type GMR element and TMR element in the CPP structure have a still larger amount of resistance change as compared with that of the MR element in the above-mentioned CIP structure, a highly-sensitive MR type magnetic head can be realized theoretically.

By the way, when data is recorded at a higher recording density, e.g., 100 Gb/inch$^2$, in order to detect narrow magnetic recording patterns having a width less than 0.1 μm, it is requested to realize a highly-precise MR element.

There has been proposed a method of manufacturing a microminiaturized MR element as what element which can meet with such requirements.

In a method of manufacturing such a microminiaturized MR element, particularly, a MR element including a magnetic flux guide layer, the microminiaturized MR element manufacturing process involves a process for simultaneously patterning a portion having a multilayer film of different materials, particularly, a multilayer structure of an insulating layer, e.g., aluminum oxide or silicon oxide and a metal layer, and a multilayer structure portion formed by a multilayer of substantially only metal layers.

This patterning can be executed by ion beam etching method for example. In this case, because etch rates of aluminum oxide or the silicon oxide of the above-mentioned insulating layer and the metal layer are remarkably different from each other, there arises a problem that a micro miniaturized MR element having an aimed structure cannot be manufactured with a satisfactory yield.

DISCLOSURE OF INVENTION

It is an object of the present invention to provide a method of manufacturing a magneto-resistive effect element and a method of manufacturing a magneto-resistive effect type magnetic head which can solve the above-mentioned problem and can produce a microminiaturized MR element having an aimed structure with high reliability.

A method of manufacturing a magneto-resistive effect element according to the present invention is a method of manufacturing a magneto-resistive effect element having a multilayer structure portion in which there are piled at least a magnetic flux guide layer, a free layer made of a soft magnetic material of which there are piled the magnetization is rotated in response to an external magnetic field, or the free layer also acting as the magnetic flux guide layer a fixed layer made of a ferromagnetic material, an antiferromagnetic magnetic layer for fixing the magnetization of the fixed layer and a spacer layer interposed between the free layer and the fixed layer, namely, an SV type GMR multilayer structure portion or a TMR multilayer structure portion.

This manufacturing method comprises a film forming process for forming a multilayer film including at least the antiferromagnetic layer, the fixed layer and the spacer layer, a first patterning process for patterning this multilayer film after a predetermined pattern, e.g., a pattern having a predetermined depth length, a process for filling up the circumference of the multilayer film thus patterned with an insulating layer, a process for forming the magnetic flux guide layer or the free layer also acting as the magnetic flux guide layer over this insulating layer and the patterned multilayer film, and a second patterning process for patterning simultaneously the magnetic flux guide layer and the above-mentioned multilayer film after a predetermined pattern, e.g., a pattern having a predetermined width to form the above-mentioned multilayer structure portion by beam etching.

Moreover, according to the present invention, when the MR element including the magnetic flux guide layer is formed, the first patterning for determining the depth of the MR element body, i.e., the above-mentioned SV type GMR multilayer structure portion or the TMR multilayer structure portion and the second patterning for determining the widths of the MR element body and the magnetic flux guide layer are executed by etching in such a manner that the materials comprising the above-mentioned multilayer structure portion and the materials comprising the above-mentioned insulating layer at approximately equal the same etch rate. This is done by selecting an incident angle of an etching beam. To be concrete, if the above-mentioned insulating layer is, e.g. silicon oxide, an angle θ relative to a normal of an etched plane is selected in the range of $10° \leq \theta \leq 40°$, preferably, $15° \leq \theta \leq 35°$.

Furthermore, in the method of manufacturing the magneto-resistive effect type magnetic head according to the present invention, the magneto-resistive effect element forming its magnetic sensing portion is manufactured by the above-mentioned magneto-resistive effect element manufacturing method.

As described above, in the present invention, the SV type GMR multilayer structure portion is, as it were, a metallic multilayer structure portion, whereas the TMR multilayer structure portion includes, e.g. aluminum oxide $Al_2O_3$ forming the tunnel barrier layer interposed as the spacer layer. However, this insulating layer is a extremely thin insulating layer having a thickness of about 0.6 nm, so that the TMR multilayer structure portion has substantially a metallic multilayer structure. For this reason, when the magnetic flux guide layer extending over the metallic multilayer portion and the insulating layer is etched together with the insulating layer, it is arranged that nearly equal etch rates are obtained by selecting the incident angle θ of the etching beam. This allows the etching depth of the above-mentioned multilayer structure portion and its circumference to be made exactly equal. Therefore, the position of the hard magnetic layer which is bias-magnetized for the free layer that will be formed on this etched portion later on can be determined with high accuracy.

BRIEF DESCRIPTION OF DRAWINGS

FIGS. 2A, 2B and 2C are a schematic plan view of an example of a magneto-resistive effect type magnetic head obtained by a manufacturing method according to the present invention and schematic cross-sectional views taken along the line B—B and the line C—C, respectively.

BEST MODE FOR CARRYING OUT THE INVENTION

To begin with, a magneto-resistive effect element (MR element) MR obtained by a manufacturing method according to the present invention and a magneto-resistive effect type magnetic head H using this MR element as a magnetic sensing portion will be described with reference to FIGS. 1 and 2.

The MR element and the magnetic sensing portion of the MR type magnetic head can be formed as the aforementioned SV type GMR structure or the aforementioned TMR structure.

FIGS. 1 and 2 show the MR elements and MR type magnetic heads both of which have the so-called bottom type structures.

Figure 1A:
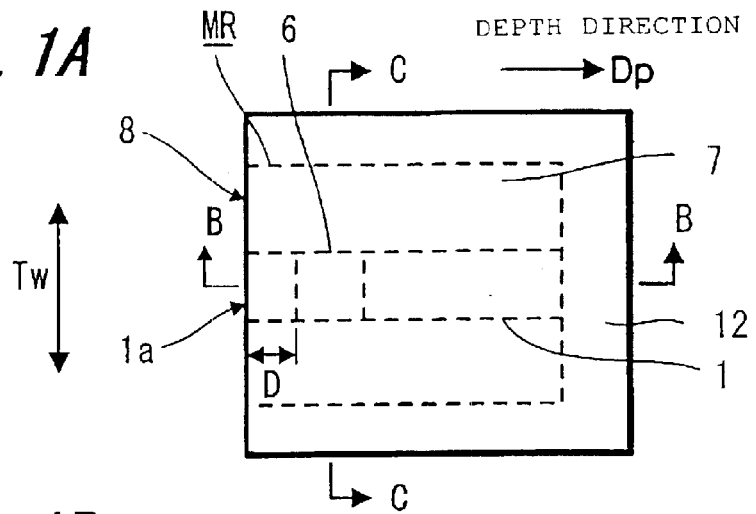
FIGS. 1A, 1B and 1C are a schematic plan view of an example of a magneto-resistive effect element obtained by a manufacturing method according to the present invention and schematic cross-sectional view taken along the line B—B and a schematic cross-sectional views taken along the line C—C, respectively.

FIGS. 1A and 2A show schematic plan views of examples of MR elements and MR type magnetic heads obtained by the manufacturing methods according to the present invention. FIGS. 1B, 2B and FIGS. 1C, 2C are schematic cross-sectional views taken along the lines B—B and C—C of FIGS. 1A and 2A, respectively.

Figure 1B:
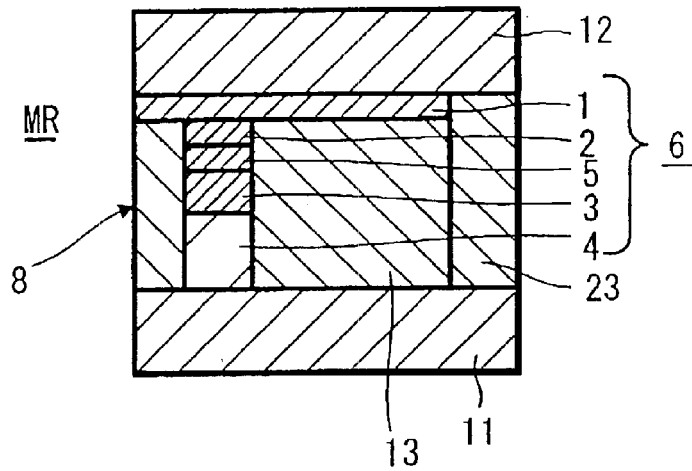
Figure 1C:
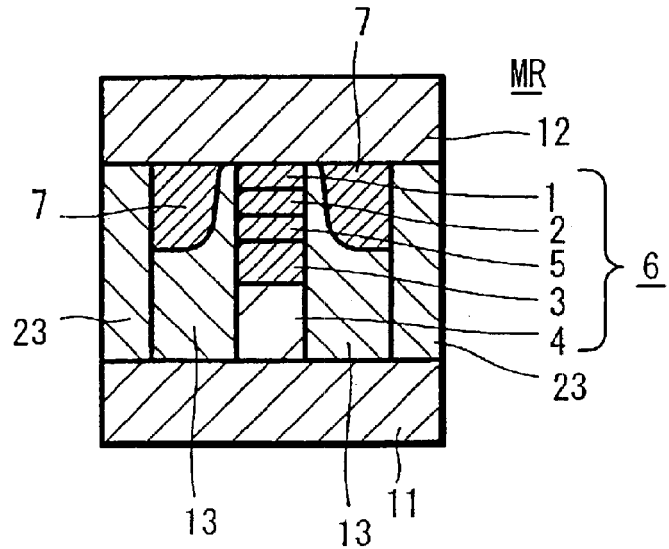

AS shown in FIGS. 1A to 1C, the MR element includes a stripe-like magnetic flux guide layer 1 which extends in a depth direction DP perpendicular to a track width direction Tw and whose front end 1a serves as an end for introducing an external magnetic field, i.e., a magnetic field and to be detected. It also includes a multilayer structure portion 6 which forms the MR element body at a limited portion on the front end 1a side of this magnetic flux guide layer 1 or at a limited portion retreating from the front end 1a in the depth direction by a required distance D. The magnetic flux guide layer 1 is superposed on the free layer 2.

This multilayer structure portion 6 includes a multilayer film formed by laminating a free layer 2 made of a soft magnetic material of which the magnetization rotates in response to an external magnetic field, a fixed layer 3 made of a ferromagnetic material, an antiferromagnetic layer 4 for fixing the magnetization of this fixed layer 3 and a spacer layer 5 interposed between the free layer 2 and the fixed layer 3.

On both sides of this multilayer structure portion 6 is located a hard magnetic layer 7 in an opposing relation to at least both side end faces of the free layer 2 and the magnetic flux guide layer 1.

This hard magnetic layer 7 forms a permanent magnet magnetized so as to apply a bias magnetic field for erasing magnetic domains generated at both ends of the free layer to improve Barkhausen noise which causes the magnetization in the free layer 2 to rotate discontinuously depending on the external magnetic field.

These magnetic flux guide layer 1 and multilayer structure portion 6 are disposed between first and second electrodes 11 and 12 to form the CPP structure in which a sense current is conducted between the first and second electrodes 11 and 12 so that the sense current may be send to the multilayer structure portion 6 in a layer-piling direction, i.e. in the direction crossing the film plane of each layer.

As shown in FIGS. 2A to 2C, the MR type magnetic head H uses the above-mentioned magneto-resistive effect element MR as a magnetic sensing portion which is disposed between first and second magnetic shields 21 and 22.

Then, the surface of the front end 1a of the magnetic flux guide layer 1 facing outside is employed as a forward surface 8 which is a surface in contact with or opposing to a magnetic recording medium. When this magnetic head H is formed as a floating type magnetic head, e.g., as a slider located at the tip end of gimbals to be floated by the flow of air produced due to the rotation of a magnetic recording medium such as a magnetic disk thereby producing a space between the head and the surface of the recording medium, the above-mentioned forward surface 8 serves as a so-called ABS (Air Bearing Surface).

While the first and second electrodes 11 and 12 as well as the magnetic shields 21 and 22 are provided in the illustrated examples, each of these electrodes 11 and 12 can be united with each of magnetic shields 21 and 22 can be modified as a magnetic shield also etching as the electrode.

In FIGS. 2A TO 2C, elements and parts identical to those of FIGS. 1A TO 1C are denoted by identical reference numerals and therefore their repeated explanations will be avoided.

When the above-mentioned multilayer structure portion 6 has the SV type GMR structure, its spacer layer 5 is formed by a nonmagnetic conductive layer. When the above-mentioned multilayer structure portion has the TMR structure, the spacer layer is formed by a tunnel barrier layer made of a nonmagnetic insulating layer.

While the magnetic flux guide 1 and the free layer 2 comprised of individual layers are shown 1A to 1C and 2A to 2C, in FIGS. The magnetic flux guide and the free layer can be formed to have a free layer/magnetic flux guide structure in which a manner that the stripe-like magnetic flux guide 1 itself forms the free layer 2 or as a structure in which the partial a thickness of the free layer serves as the magnetic flux guide layer 1.

While, in the above illustrated example, the front end 1a of the magnetic flux guide layer 1 opens on the forward surface 8 and the multilayer structure portion 6 of the MR element body forming, e.g. the SV type GMR or TMR element is disposed at the position retreated from the forward surface 8 in the depth direction DP by the required distance D, the present invention is not limited thereto and this multilayer structure portion 6 may be disposed at the position opening on the forward surface 8.

However, when the multilayer structure portion 6 is disposed at the position opening on the forward surface 8, because characteristics of the MR element body, e.g., its shape and size will be determined in a polish and work process required to form the forward surface 8, the polish and work process should be done with high accuracy, so that disadvantages such as fluctuations of characteristics, non-uniform characteristics and decreased yield cannot be avoided. Accordingly, the element body, i.e., the multilayer structure portion 6 should preferably be disposed at the position retreated from the forward surface 8 so that the magnetic flux guide layer 1 may introduce a external magnetic field to be detected, i.e., a magnetic flux.

Although an example of the method of manufacturing the MR element and the MR type magnetic head will now be described with reference to FIGS. 3A to 11C, it is needless to say that the manufacturing method according to the present invention is not limited to this example.

FIGS. 3A to 11A are schematic plan views. FIGS. 3B to 11B and FIGS. 3C to 11C are cross-sectional views taken along the lines B—B and C—C in FIGS. 3A to 11A, respectively.

Figure 3A:
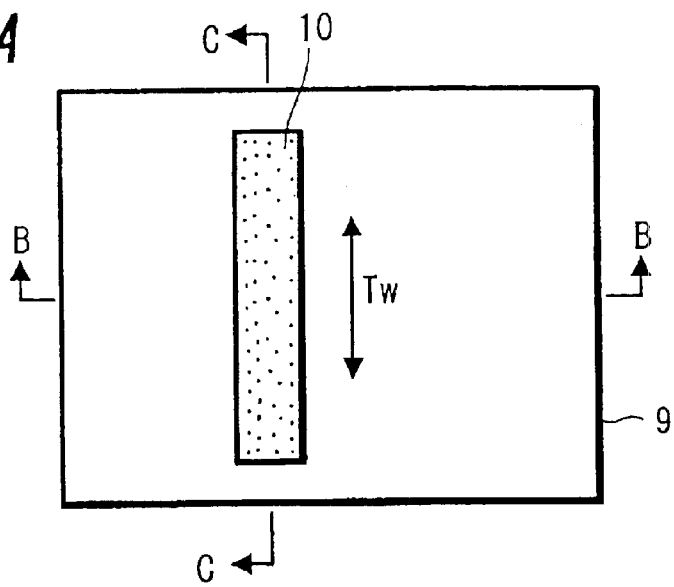
FIGS. 3A, 3B and 3C are a schematic plan view showing one process of an example of methods of manufacturing a magneto-resistive effect element and a magneto-resistive effect type magnetic head according to the present invention, a schematic cross-sectional view taken along the line B—B the line C—C, respectively.
Figure 3B:
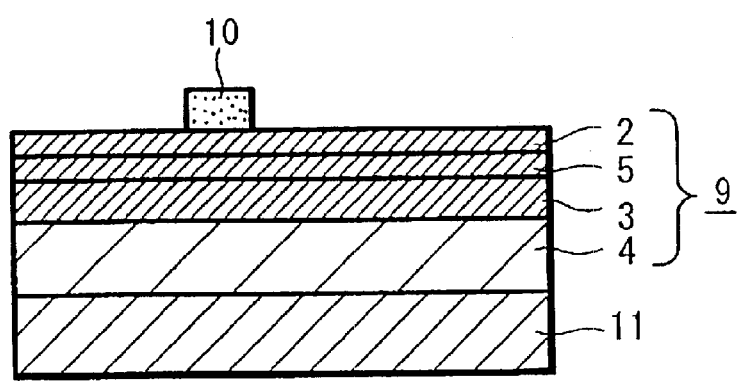
Figure 3C:
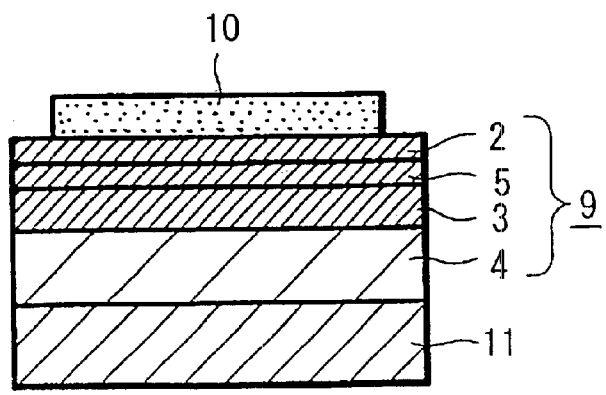

As shown in FIGS. 3A to 3C, a first electrode 11 is formed on a substrate (not shown) made of AlTiC, for example. Then, a multilayer film 9 is formed by sequentially piling part of an antiferromagnetic layer 4, a fixed layer 3, a spacer layer 5 and a free layer 2 by means of, e.g. magnetron sputtering or ion beam sputtering.

The first electrode 11 is formed of a conductive layer such as Ta, Au and Cu having a thickness of, e.g. about 3 nm to 20 nm.

The antiferromagnetic layer 4 is formed by piling films of PtMn, IrMn, RhMn, PdPtMn, NiMn and the like having thicknesses of, e.g. 6 nm to 30 nm through buffer seed layers (not shown) of Ta, NiFe, Cu, and NiFeCr and the like.

The fixed layer 3 is made of a ferromagnetic material such as CoFe, NiFe and Co having a thickness of 2 nm to 10 nm and is formed so as to be exchange coupled with the antiferromagnetic layer 4.

This fixed layer 3 can be formed as a so-called multilayered ferri-layer structure based upon an antiferromagnetic coupling in which a Ru layer of a nonmagnetic layer is interposed between multilayers, e.g., two layers of, e.g. Co layers.

The spacer layer 5 is formed of a nonmagnetic layer made of Cu and the like having a thickness of 2 nm to 5 nm for example, in the SV type GMR structure. In the TMR structure, the spacer layer is formed of an $Al_2O_3$ of natural Al oxide film or a plasma oxide film having a thickness of 0.4 to 2.0 nm for example.

Further, the soft magnetic layer forming the free layer 2 or part of the free layer 2 is formed of a single layer-or a multilayer film of Co, CoFe and NiFe having a thickness of 1 nm to 5 nm for example.

On this multilayer film 9, there is formed a first mask 10 serving as an etching mask and a lift-off layer, which will be described later, like a stripe extending in the direction of track width Tw. This first mask 10 can be formed by patterning a photoresist using the photolithography. Typically, through not shown, this mask 10 is formed of a double-layer resist having an undercut or a bridge-like resist so that the lift-off can be executed satisfactorily.

Figure 4A:
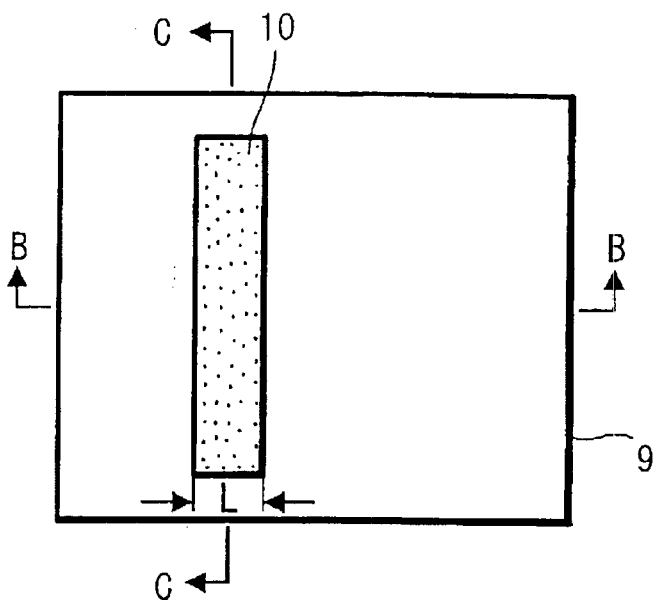
FIGS. 4A, 4B and 4C are a schematic plan view of one process of an example of methods of manufacturing a magneto-resistive effect element and a magneto-resistive effect type magnetic head according to the present invention, a schematic cross-sectional view taken along the line B—B and the line C—C, respectively.
Figure 4B:
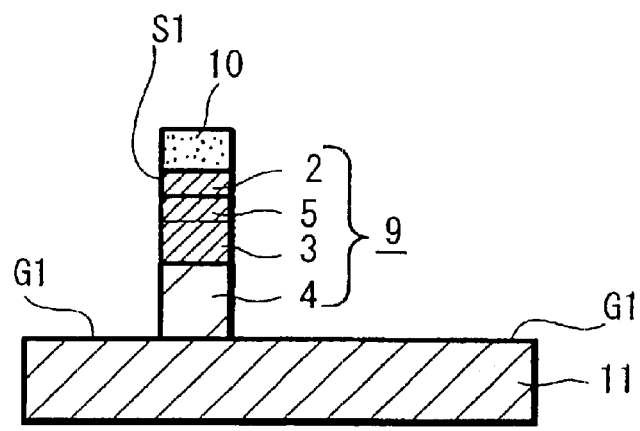
Figure 4C:
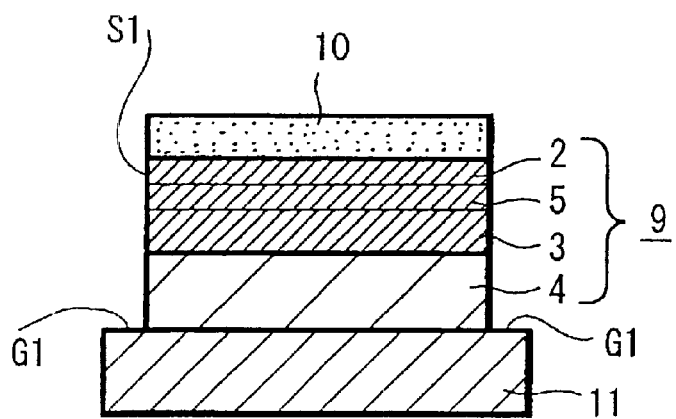

Next, as shown in FIGS. 4A to 4C, using the first mask 10 as an etching mask, the first patterning process is effected on the multilayer film 9, e.g. by ion beam etching. As a result, a first stripe portion SI which has a stripe shape extending in the track width direction after the pattern of the mask 10 is formed. The first stripe portion SI has a required predetermined depth length L.

Figure 5A:
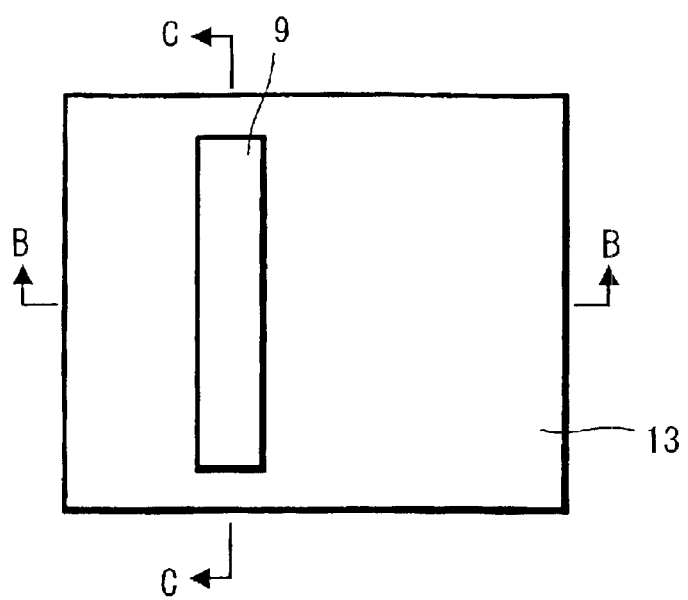
FIGS. 5A, 5B and 5C are a schematic plan view showing one process of an example of methods of manufacturing a magneto-resistive effect element and a magneto-resistive effect type magnetic head according to the present invention, a schematic cross-sectional view taken along the line B—B and the line C—C, respectively.
Figure 5B:
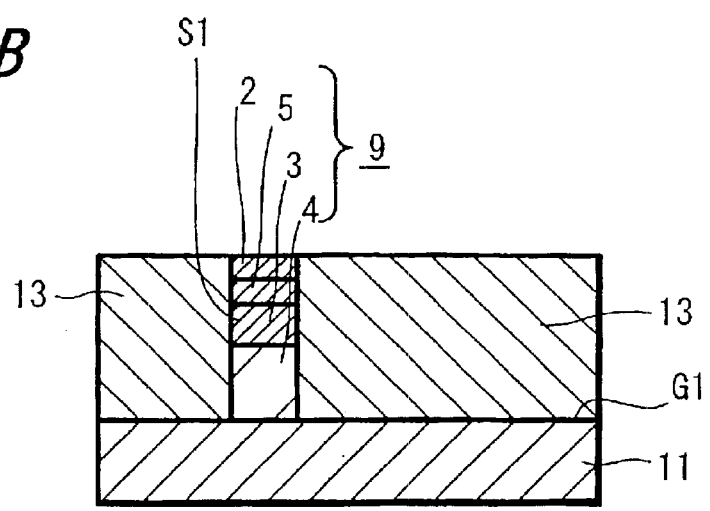
Figure 5C:
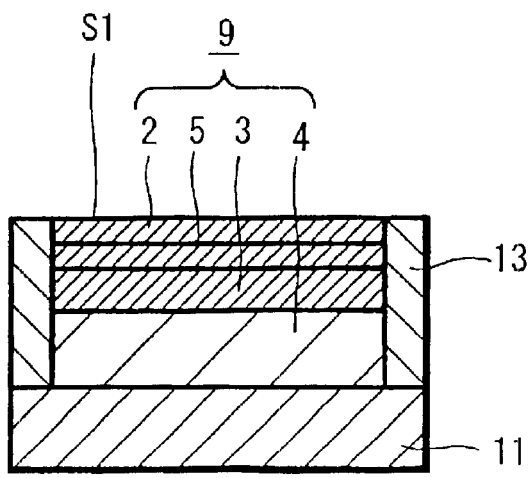

Next, as shown in FIGS. 5A to 5C, a recess or groove G1 surrounding the multilayer film 9 of the first stripe portion S1 formed by this etching, i.e., the first patterning process is buried with an insulating layer 13, e.g. silicon oxide in the present invention, having a thickness corresponding to the thickness of the multilayer film 9. The insulating layer 13 is formed on the whole surface by a suitable means such as magnetron sputtering or ion beam sputtering, and then the mask 10 of FIGS. 4A to 4C is removed. By removing this mask 10, the insulating layer 13 on this mask 10 is removed, i.e. lifted off. Thus, the insulating layer 13 fills up the circumference of the multilayer film 9, whereby the surface can be made flat.

Figure 6A:
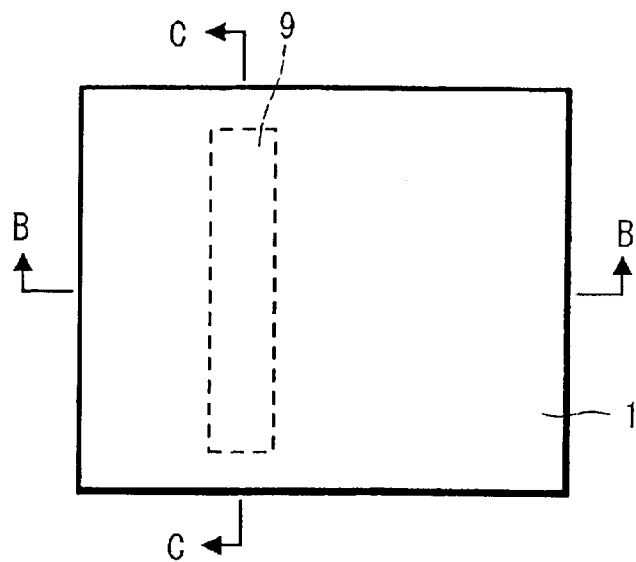
FIGS. 6A, 6B and 6C are a schematic plan view showing one process of an example of methods of manufacturing a magneto-resistive effect element and a magneto-resistive effect type magnetic head according to the present invention, a schematic cross-sectional views taken along the line B—B and a schematic cross-sectional view taken along the line C—C, respectively.
Figure 6B:
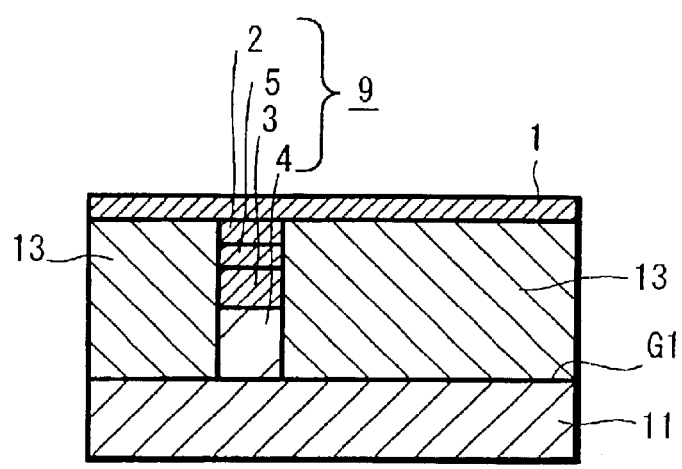
Figure 6C:
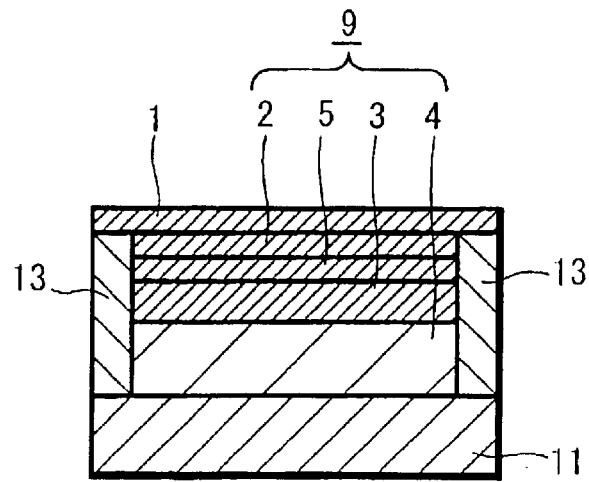

As shown in FIGS. 6A to 6C, on this flat surface, a single film or a multilayer film of, e.g. Ni, Fe, Co, NiFe, CoFe having a thickness of 1 nm to 10 nm is formed on the whole surface as the magnetic flux guide layer 1.

Figure 7A:
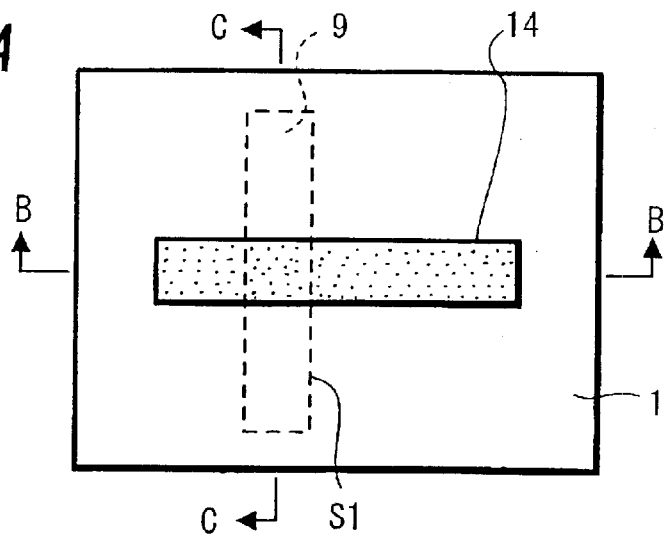
FIGS. 7A, 7B and 7C are a schematic plan view showing one process of an example of methods of manufacturing a magneto-resistive effect element and a magneto-resistive effect type magnetic head according to the present invention and schematic cross-sectional views taken along the line B—B and the line C—C, respectively.
Figure 7B:
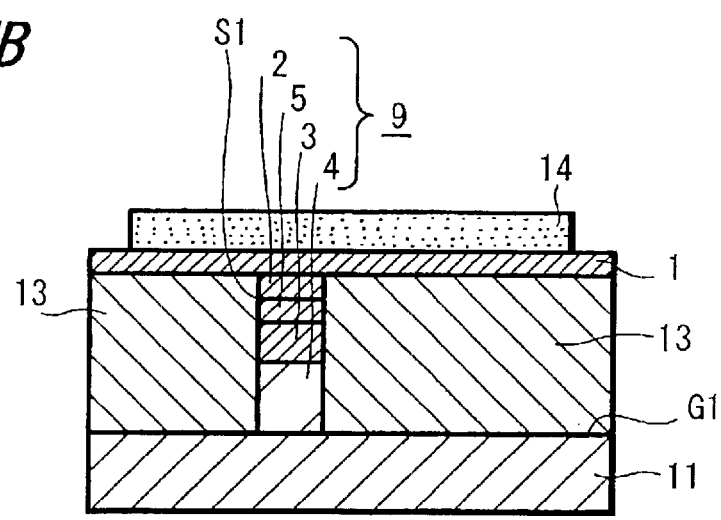
Figure 7C:
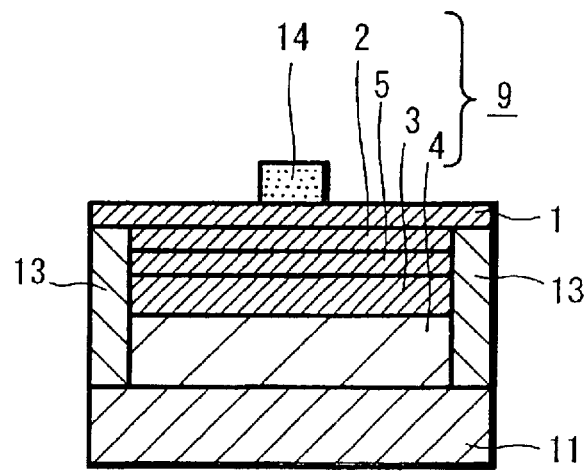

As shown in FIGS. 7A TO 7C, on the magnetic flux guide layer 1, there is formed a second mask 14 having a stripe shape which extends in the depth direction and intersects the first stripe portion S1 of the multilayer film 9.

This second mask 14 can be formed by the same method as that used to form the above-mentioned first mask 10.

In order that this second mask 14 may be formed in a predetermined positional relationship with the first stripe portion S1, an exposure mask in the photolithography used to form the second mask 14 is precisely positioned with respect to an exposure mask in the photolithography used to form the aforementioned first mask 10.

Note that, in this manufacturing method, the exposure masks are precisely positioned with each other only when this second mask 14 is formed.

Then, in this positional matching, the stripe lengths of the two masks are selected so that the second mask 14 may securely intersect the area where the first mask 10 is formed.

Figure 8A:
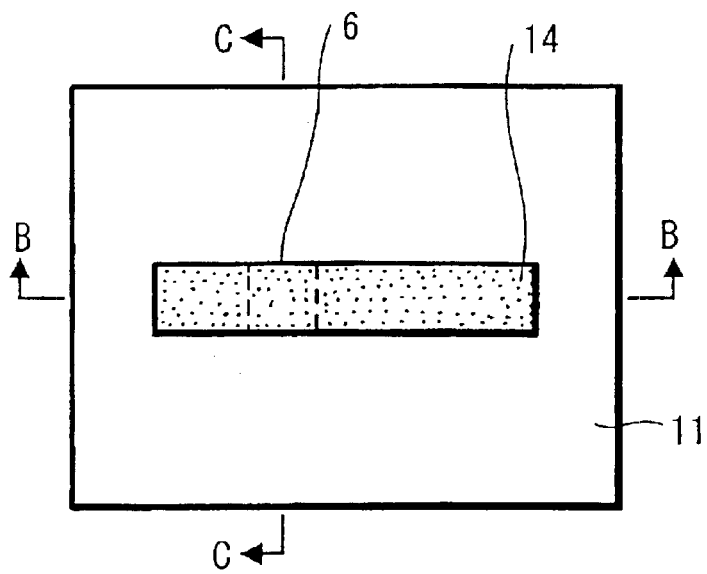
FIGS. 8A, 8B and 8C are a schematic plan view showing one process of an example of methods of manufacturing a magneto-resistive effect element and a magneto-resistive effect type magnetic head according to the present invention and schematic cross-sectional views taken along the line B—B and the line C—C, respectively.
Figure 8B:
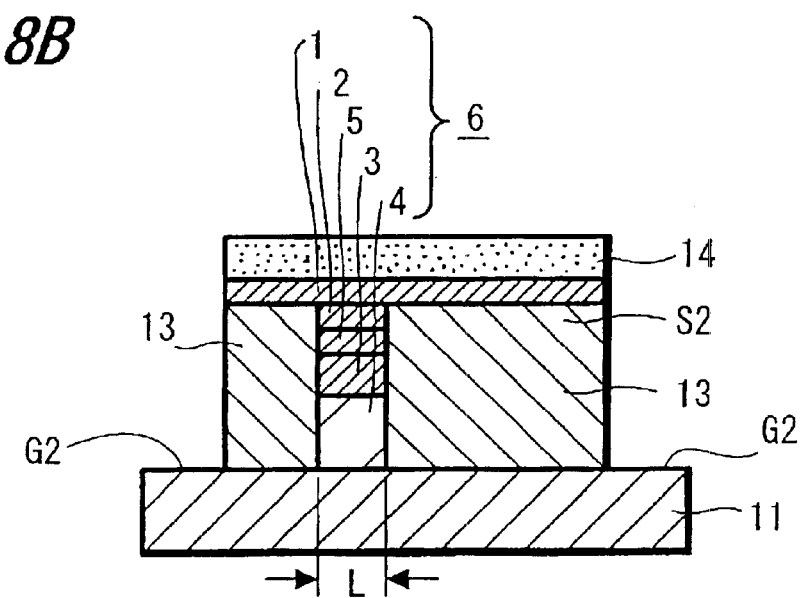
Figure 8C:
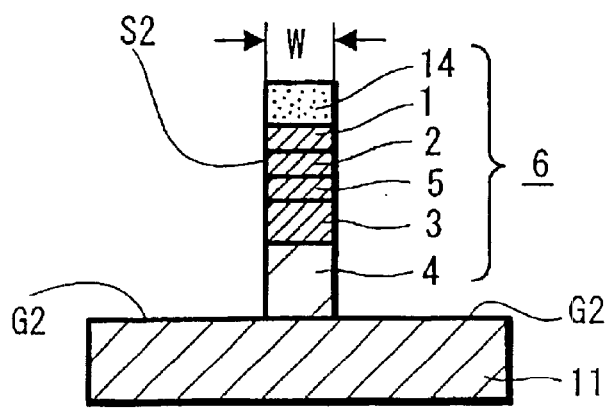

Next, as shown in FIGS. 8A to 8C, using the second mask 14 as an etching mask, there is formed a second stripe portion S2 having a predetermined required rack width by effecting the second patterning process on the magnetic flux guide layer 1, and the multilayer film 9 and the insulating layer 13 under the magnetic flux guide layer 1, e.g. by Ar ion beam etching.

In this manner, there is formed the multilayer structure portion 6 having a small area of which the required depth length L is determined by the first patterning process and of which the required width W the track width direction is determined by the second patterning process.

Particularly, the method according to the present invention is characterized by selecting an incident angle of this etching beam, in this second patterning process, so that etch rates of all component materials of the multilayer structure portion 6 including the magnetic flux guide layer 1 may be approximately equal to an etch rate of silicon oxide of the component material of the insulating layer 13.

Figure 12:
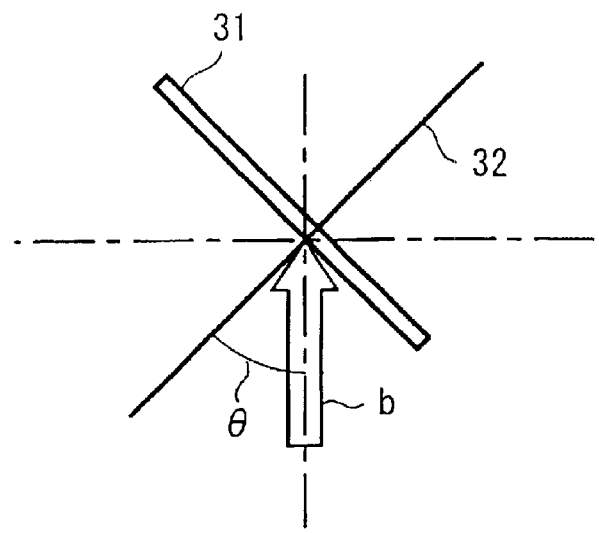
FIG. 12 is a diagram for explaining a beam incident angle of a beam etching in the present invention.

In this etching, as shown in FIG. 12, the above-mentioned etch rates can be made nearly equal to each other by selecting an incident angle θ of an ion beam b to an ion etched surface 31 (an angle to a normal 32 of the ion etched surface 31) in the range of $10° \leq \theta \leq 40°$, preferably $15° \leq \theta \leq 35°$.

In this way, the first stripe portion S1 is etched to the predetermined track width W, and the multilayer structure portion 6 having the SV type GMR structure or the TMR structure made by piling of the magnetic flux guide layer 1, the free layer 2, the spacer layer 5, the fixed layer 3 and the antiferromagnetic layer 4 is formed only at a portion where the first and second stripe potions S1 and S2 cross with each other.

In this case, as described above, because the etch rates of the insulating layer 13 made of the silicon oxide and the metal layers are made approximately equal to each other, it is possible to prevent stepped portions and the like from being produced when there exists a difference in the progress of etching is formed between the multilayer film 9 forming the structure portion 6 and the other portions.

Specifically, in an ordinary etching in which the ion beam is introduced from the vertical direction, as a table 5 shows examples of the respective materials and their etch rates, since the etch rate of the insulating layer 13 made of silicon oxide is remarkably low compared with that of the metallic multilayer portion in the multilayer film 9. Thus, when the etching is satisfactorily executed in the multilayer film 9 when the pattern of the multilayer structure portion 6 is formed, an etch residue is produced in the insulating layer 13. Thereafter, there arises a disadvantage when the hard magnetic film is formed on this insulating layer 13 as will be described later.

Figure 9A:
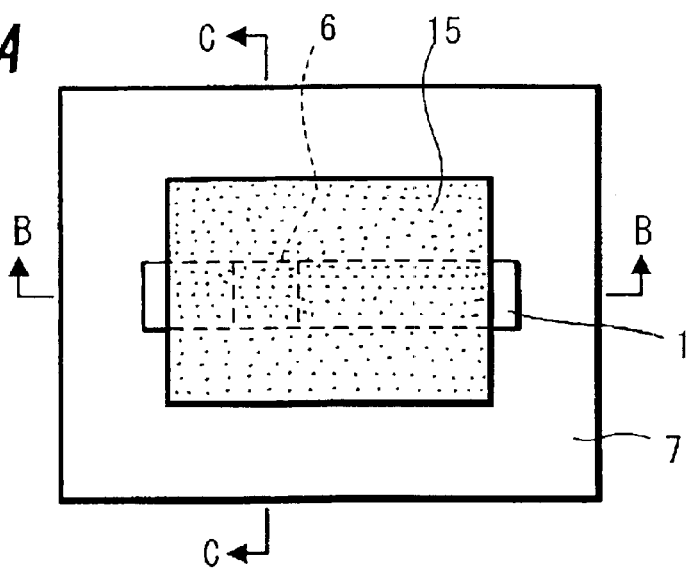
FIGS. 9A, 9B and 9C are a schematic plan view showing one process of an example of methods of manufacturing a magneto-resistive effect element and a magneto-resistive effect type magnetic head according to the present invention and schematic cross-sectional view taken along the line B—B and the line C—C, respectively.
Figure 9B:
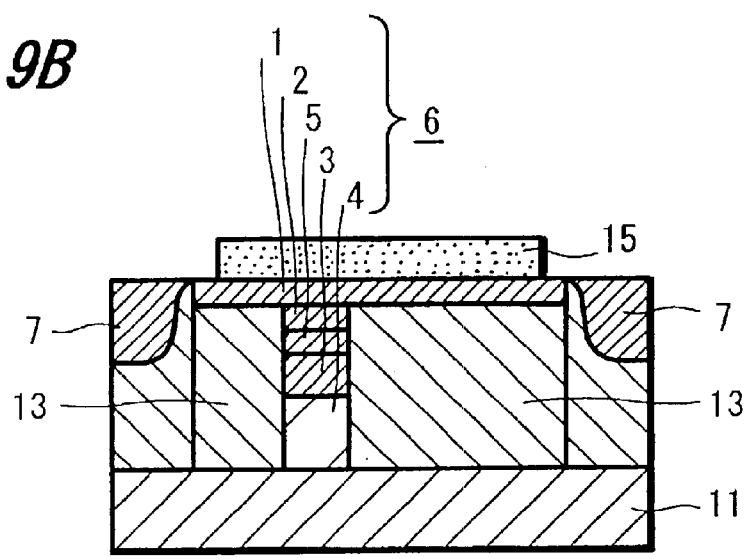
Figure 9C:
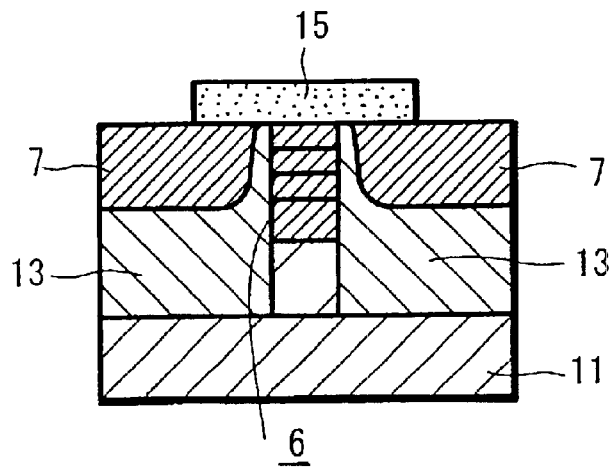

Next, a groove G2 surrounding the second stripe portion S2 formed by this second patterning process is filled up. As shown in FIGS. 9A to 9C the insulating layer 13 made of silicon oxide and the hard magnetic layer 7 are sequentially formed to a thickness corresponding to the thickness of the stripe portion S2 by magnetron sputtering or ion beam sputtering. The second mask 14 of FIGS. 8A to 8C is removed and the insulating layer 13 and the hard magnetic layer 7 on the second mask are lifted off. The surface is made flat in this manner.

The insulating layer 13 at this time is made of silicon oxide having a thickness of, e.g. 5 nm to 20 nm and the hard magnetic layer 7 is made of, e.g. $Co—\gamma Fe_2O_3$ with a high resistance or CoCrPt, CoNiPt, CoPt and the like with a low resistance having a thickness of, e.g. 10 nm to 50 nm. The hard magnetic layer 7 is and which is magnetized to form a permanent magnet.

In this case, the insulating layer 13 is formed so that the insulating layer may cover on the peripheral side surface of the multilayer structure portion 6 to be interposed between the hard magnetic layer 7 and the multilayer structure portion 6. Thus, even if the hard magnetic layer 7 is made of the above-mentioned low-resistance layer, the multilayer structure portion 6 and can electrically be insulated from the hard magnetic layer 7 by the insulating layer 13.

The position of the hard magnetic layer 7 with respect to a layer-piling direction of the multilayer structure portion 6 is set to be in a predetermined positional relationship with the free layer 2 and the magnetic flux guide layer 1 as will be described later.

Furthermore, as shown in FIGS. 9A to 9C, a third mask 15 which will serve as an etching mask and will be used in the lift-off later is formed by photo lithography using a photo resist similarly to the aforementioned respective masks, so as to cover the respective portions of the stripe-like magnetic flux guide layer 1 and the hard magnetic layer 7 which are finally required.

Figure 10A:
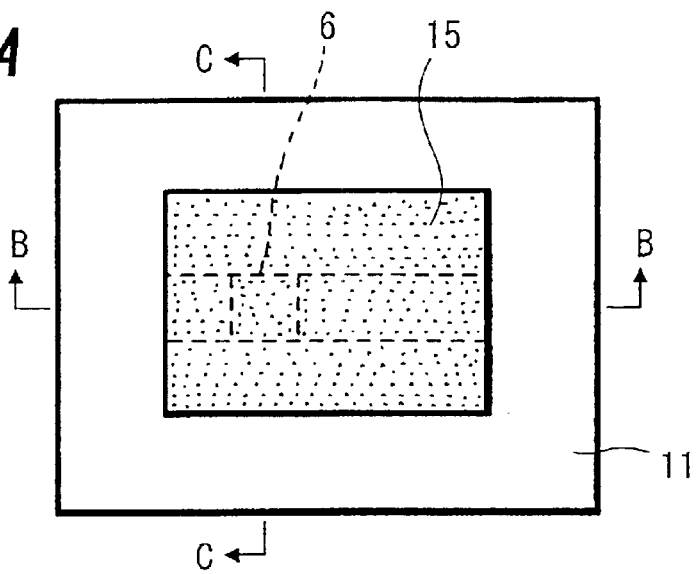
FIGS. 10A, 10B and 10C are a schematic plan view showing one process of an example of methods of manufacturing a magneto-resistive effect element and a magneto-resistive effect type magnetic head according to the present invention, a schematic cross-sectional view taken along the line B—B and the line C—C, respectively.
Figure 10B:
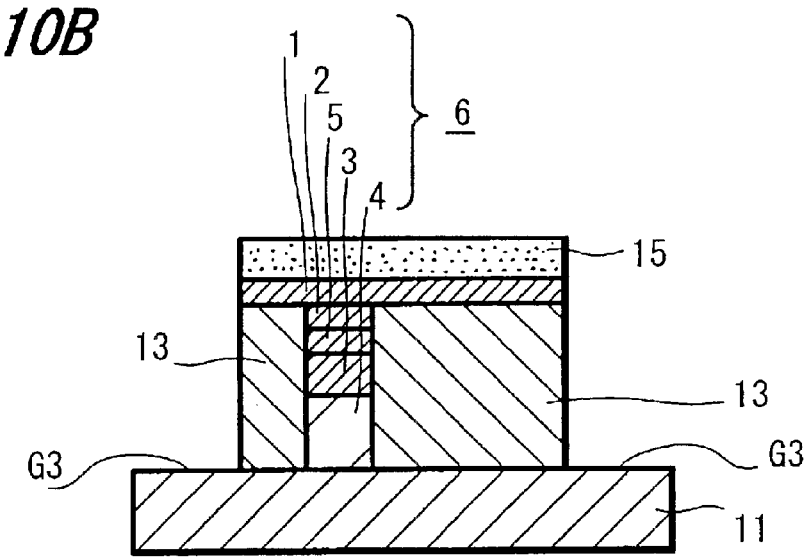
Figure 10C:
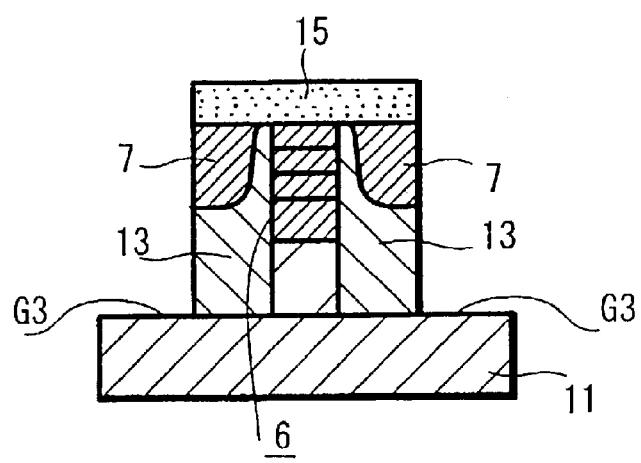

Then, using this mask 15 as an etching mask, as shown in FIGS. 10A to 10C, a portion of the hard magnetic layer 7 which is not covered with this mask 15, a portion of the insulating layer 13 under the portion of hard magnetic layer and the like are removed by etching.

Figure 11A:
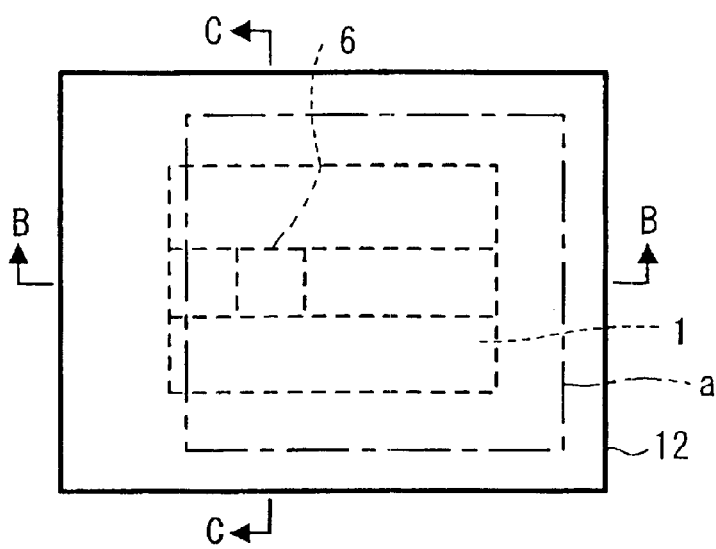
FIGS. 11A, 11B and 11C are a schematic plan view showing one process of an example of methods of manufacturing a magneto-resistive effect element and a magneto-resistive effect type magnetic head according to the present invention and a schematic cross-sectional views taken along the line B—B and the line C—C, respectively.
Figure 11B:
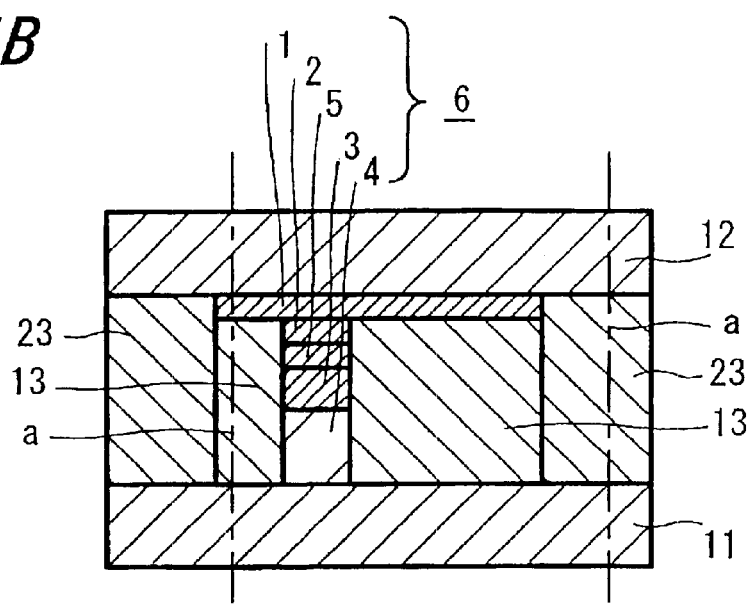
Figure 11C:
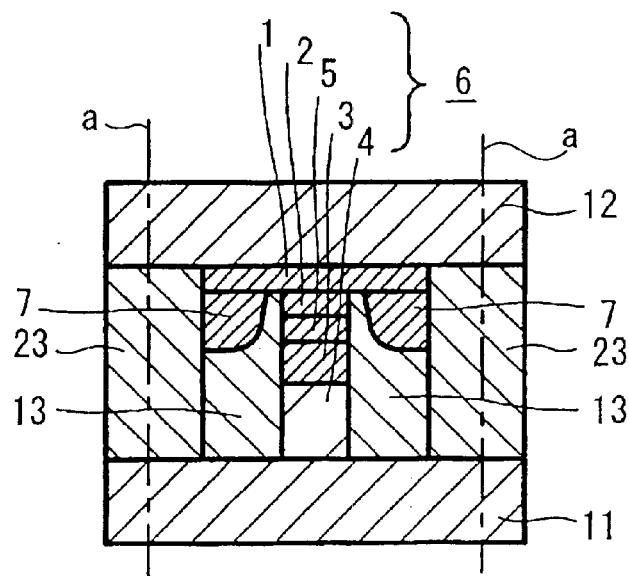

Subsequently, as shown in FIGS. 11A TO 11C, an insulating layer 23 made of silicon oxide or aluminum oxide and the like is formed so as to fill up a groove G3 formed by this etching and the insulating layer 23 on the third mask 15 is lifted off by removing the third mask.

In this way, the surface is made flat and the second electrode 12 is formed on this flat surface by a suitable means such as sputtering.

Then, the wafer thus formed is cut, e.g. into each MR element along the surface shown by a dot-and-dash line "a" in FIGS. 11A to 11C, and the desired magneto-resistive effect element MR is obtained by grinding and processing the forward surface 8 which serves as a surface for introducing an external magnetic field, i.e., a magnetic field to be detected as shown in FIGS. 1A to 1C.

Moreover, in manufacturing when the magneto-resistive effect type magnetic head H shown in FIGS. 2A to 2C, each of the first and second electrodes 11 and 12 shown in FIGS. 11A to 11C may be made to serve as a magnetic shield also. Alternatively, first and second magnetic shields 21 and 22 (not shown) may respectively be made to the outer surfaces of the electrodes 11 and 12 to formed the so-called shield type structure.

As described above, the magneto-resistive effect element MR obtained by the manufacturing method according to the present invention or the magneto-resistive effect type magnetic head H comprising this element MR has the construction in which the multilayer structure portion 6 disposed between the magnetic shields or the electrodes 11 and 12, as it were, the element body is surrounded by the insulating material 13 and so insulated from the hard magnetic layer 7. Thus, even when a sense current is conducted between the two electrodes 11 and 12 in a CPP type structure, it is possible to avoid the leakage of the sense current through this hard magnetic layer 7.

The hard magnetic layer 7 can stabilize the magnetic flux guide layer 1 and the free layer 2 by applying the magnetic field from the permanent magnet formed of this hard magnetic layer 7 to the magnetic flux guide layer 1 and the free layer 2 along a track width direction. The magnetic flux guide layer 1, the free layer 2 and the hard magnetic layer 7 are magnetostatically coupled with one another magnetically. When the hard magnetic layer 7 is conductive, the film thickness of the above-mentioned insulating layer 13 interposed between those layers is selected to be so small that the insulating layer can insulate the hard magnetic electrically.

As described above, because the MR element body, i.e., the multilayer structure portion 6 structure in which it is buried into the insulating layer 13 in construction, the magnetic flux guide layer 1 can be in contact with the whole surface of the free layer 2 and can be extended to the front portions and the rear or the rear portions of the multilayer structure portion 6.

When the free layer 2 of the MR element body is formed between the front magnetic flux guide and the rear magnetic flux guide, a magnetic flux to be detected is introduced into the front end 1a of the magnetic flux guide layer 1, which is open on forward surface 8, attenuated through the free layer 2 serving as a detecting portion and lost at the end of the rear magnetic flux guide.

This means that, when the rear magnetic flux guide is provided, the amount of magnetic flux which passes the magnetic flux detecting portion increases compared with the case where the rear magnetic flux guide is not provided. As a result, the output signals from the SV type GMR type and TMR type reproducing having the magnetic flux guide heads can be increased. In short, it is to be understood that the magnetic flux guide layer 1 is extremely important for realizing a high-sensitivity magnetic head.

Further, a space between the magnetic shields, i.e., a magnetic gap length is selected depending upon a spatial resolution limited by a target recording density of a magnetic head, e.g., in the range of 50 nm to 100 nm if a target recording density is 100 Gb/inch$^2$.

On the other hand, for example, the thickness of the second electrode 11, and the like are selected so that the magnetic flux guide layer 1 and the free layer 2 are located nearly at the center of the gap.

Figure 13:
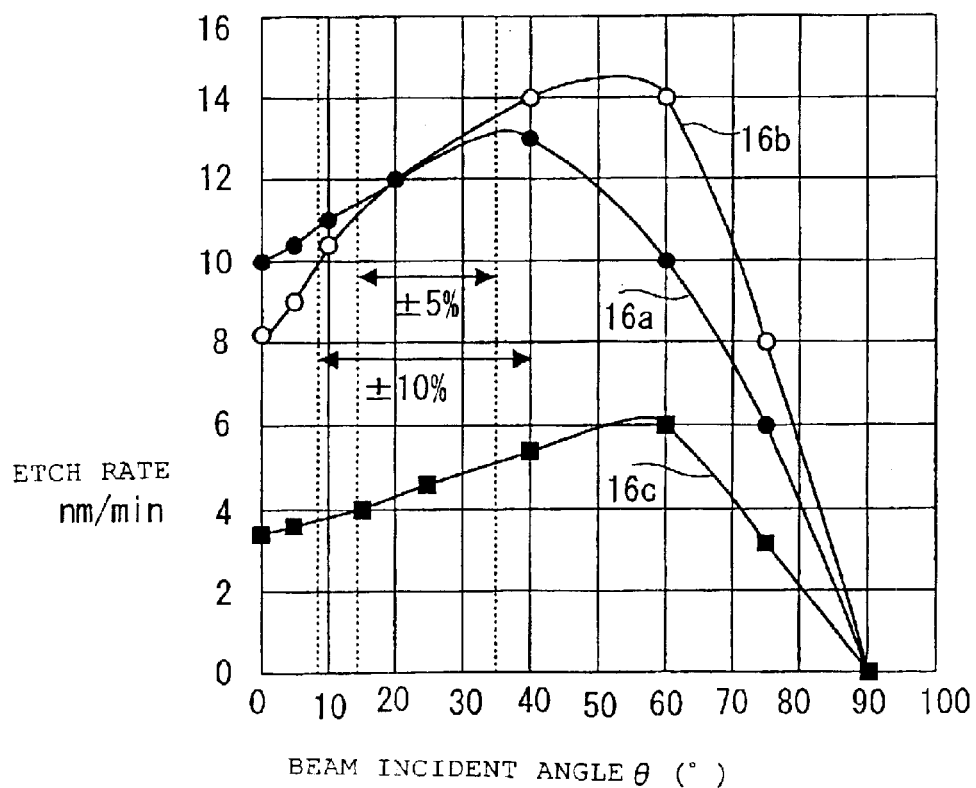
FIG. 13 is a diagram showing measured results of a relationship between the beam incident angle of the beam etching and an etch rate in the present invention.

As described above, the manufacturing method according to the present invention aims to equalize the etch rates to each other by selecting the beam incident angle θ of the ion beam etching in the second patterning process. This will be explained below. FIG. 13 shows measured results of etch rates obtained when the incident angles θ of beam in the Ar ion beam etching and materials of the etched layers are changed. In this graph, curves 16a, 16b and 16c are such that measured results of etch rates relating to the multilayer film 9 in the SV type GMR structure, similar measured results relating to silicon oxide and similar measured results of etch rates relating to aluminum oxide are potted, respectively.

As is clear from these curves, when the silicon oxide is used as the insulating layer 13 and, for example, the incident angle θ of the argon ion beam, is selected in the range of 10° to 40°, a difference between the etch rates of the multilayer film 9 and the silicon oxide film be made to can be made to fall within the range of ±10%. Further, when the above incident angle is selected in the range of 15° to 35°, the above-mentioned difference can be made to fall within the range of ±5%.

The tables 1 to 4 show relationships among etch rates in the respective material layers, the etching thicknesses of the respective layers and the required etching time in the bottom the SV-GMR element, when the etching angle (beam incident angle) θ is selected to be −5°, −15°, −25°, −40°, respectively.

TABLE 1

Etching angle θ = −5°

| Material | Film name | Etch rate (nm/min) | Etching thickness (nm) | Etching time required (min) |
|---|---|---|---|---|
| NiFe | Magnetic flux guide layer | 9 | 4 | 0.44 |
| CoFe | Free layer | 9 | 1 | 0.11 |
| Cu | Spacer layer | 15 | 2.5 | 0.17 |
| CoFe | Fixed layer | 9 | 3 | 0.33 |
| PtMn | Antiferro-magnetic layer | 12 | 15 | 1.25 |
| Ta | Electrode | 7 | 5 | 0.71 |
| Total of above-mentioned all layers | | | 30.5 | 3.02 |
| Silicon oxide layer | Insulating layer | 9 | 27.2 | 3.02 |
| Aluminum oxide layer | Insulating layer | 4 | 12.1 | 3.02 |

TABLE 2

Etching angle θ = −15°

| Material | Film name | Etch rate (nm/min) | Etching thickness (nm) | Etching time required (min) |
|---|---|---|---|---|
| NiFe | Magnetic flux guide layer | 9 | 4 | 0.44 |
| CoFe | Free layer | 9 | 1 | 0.11 |
| Cu | Spacer layer | 16 | 2.5 | 0.16 |
| CoFe | Fixed layer | 9 | 3 | 0.33 |
| PtMn | Antiferro-magnetic layer | 12 | 15 | 1.25 |
| Ta | Electrode | 7 | 5 | 0.71 |
| Total of above-mentioned all layers | | | 30.5 | 3.01 |

TABLE 2-continued

Etching angle θ = −15°

| Material | Film name | Etch rate (nm/min) | Etching thickness (nm) | Etching time required (min) |
|---|---|---|---|---|
| Silicon oxide layer | Insulating layer | 10.5 | 31.6 | 3.01 |
| Aluminum oxide layer | Insulating layer | 4 | 12.0 | 3.01 |

TABLE 3

Etching angle θ = −25°

| Material | Film name | Etch rate (nm/min) | Etching thickness (nm) | Etching time required (min) |
|---|---|---|---|---|
| NiFe | Magnetic flux guide layer | 11 | 4 | 0.36 |
| CoFe | Free layer | 11 | 1 | 0.09 |
| Cu | Spacer layer | 19 | 2.5 | 0.13 |
| CoFe | Fixed layer | 11 | 3 | 0.27 |
| PtMn | Antiferro-magnetic layer | 14 | 15 | 1.07 |
| Ta | Electrode | 9 | 5 | 0.56 |
| Total of above-mentioned all layers | | | 30.5 | 2.49 |
| Silicon oxide layer | Insulating layer | 12 | 29.8 | 2.48 |
| Aluminum oxide layer | Insulating layer | 4.5 | 11.2 | 2.49 |

TABLE 4

Etching angle θ = −40°

| Material | Film name | Etch rate (nm/min) | Etching thickness (nm) | Etching time required (min) |
|---|---|---|---|---|
| NiFe | Magnetic flux guide layer | 12 | 4 | 0.33 |
| CoFe | Free layer | 12 | 1 | 0.08 |
| Cu | Spacer layer | 22 | 2.5 | 0.11 |
| CoFe | Fixed layer | 12 | 3 | 0.25 |
| PtMn | Antiferro-magnetic layer | 15 | 15 | 1.00 |
| Ta | Electrode | 10 | 5 | 0.50 |
| Total of above-mentioned all layers | | | 30.5 | 2.28 |
| Silicon oxide layer | Insulating layer | 14 | 31.9 | 2.27 |
| Aluminum oxide layer | Insulating layer | 5.5 | 12.5 | 2.27 |

TABLE 5

Etching angle θ = 0°

| Material | Film name | Etch rate (nm/min) | Etching thickness (nm) | Etching time required (min) |
|---|---|---|---|---|
| NiFe | Magnetic flux guide layer | 8.5 | 4 | 0.47 |
| CoFe | Free layer | 9 | 1 | 0.11 |
| Cu | Spacer layer | 14.5 | 2.5 | 0.17 |
| CoFe | Fixed layer | 9 | 3 | 0.33 |

TABLE 5-continued

Etching angle θ = 0°

| Material | Film name | Etch rate (nm/min) | Etching thickness (nm) | Etching time required (min) |
|---|---|---|---|---|
| PtMn | Antiferro-magnetic layer | 12 | 15 | 1.25 |
| Ta | Electrode | 7 | 5 | 0.71 |
| Total of above-mentioned all layers | | | 30.5 | 3.05 |
| Silicon oxide layer | Insulating layer | 8.2 | 25.0 | 3.05 |
| Aluminum oxide layer | Insulating layer | 3.2 | 9.8 | 3.05 |

As is clear from FIG. 13 and the tables 1 to 4, when the insulating layer 13 is made of silicon oxide, the required etching time of the multilayer film 9 can be approximated to the required etching time of the insulating layer 13, even if the thickness of the silicon oxide is increased. In contrast, when the insulating layer is made of aluminum oxide, the thickness of the aluminum oxide at which the required etching time can be approximated to that of the multilayer film 9 is too small to fit practical use.

This is an example in which the magneto-resistive effect element has the SV type GMR multilayer structure. In the TMR multilayer structure element, e.g. the aluminum oxide $Al_2O_3$, forming the tunnel barrier layer is interposed as the spacer layer. However, this insulation layer is an extremely thin insulation layer having a thickness of about 0.6 nm and so the TMR multilayer structure is substantially a metallic multilayer structure. Thus, the etchings can be executed uniformly in such a manner that the etch rates are made approximately equal to each other by selecting the incident angle θ of the etching beam as well.

As mentioned before, in order to avoid a Barkhausen jump by removing the magnetic domains generated at the ends of the magnetic flux guide layer 1 and the free layer 2, the product of the magnetic moment of the permanent magnet formed of the hard magnetic layer 7 by its film thickness must be made nearly equal to or larger than that of the magnetic flux guide layer 1 and the free layer 2. Because the magnetic moment of the hard magnetic layer 7 is generally smaller than those of the magnetic flux guide layer 1 and the free layer 2, a thickness of the hard magnetic layer 7 is selected to be considerably larger than the those of the magnetic flux guide layer 1 and the free layer 2. Besides, in order that the bias magnetic field generated from the hard magnetic layer 7 may efficiently be applied to the magnetic flux guide layer 1 and the free layer 2, at least end faces on the both sides of these magnetic flux guide layer 1 and free layer 2 must be placed in a positional relationship exactly opposite to the corresponding end face of the hard magnetic layer 7.

Figure 14A:
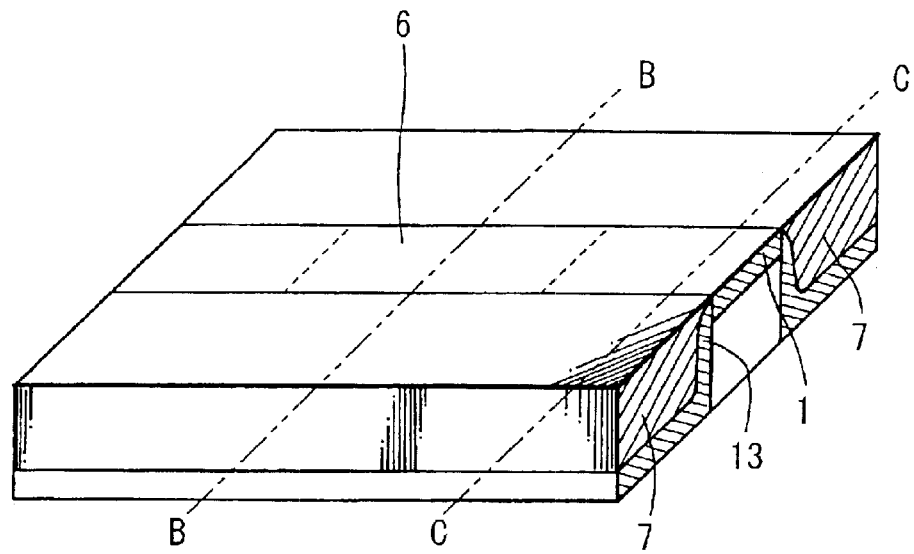
FIGS. 14A, 14B and 14C are a perspective view of a main part of an MR element manufactured by a manufacturing method according to the present invention and cross-sectional view taken along the line B—B and a cross-sectional views taken along the line C—C, respectively.
Figure 14B:
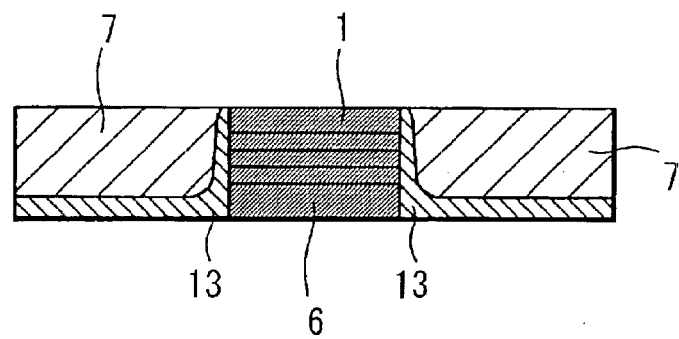
Figure 14C:
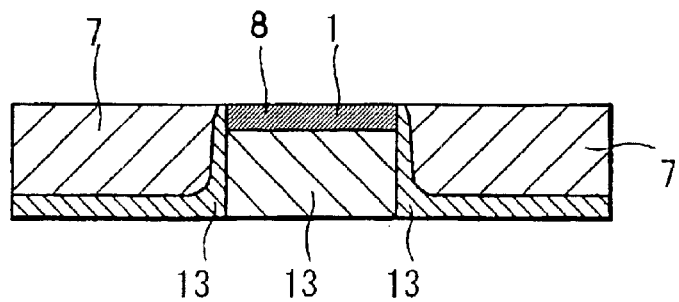

FIGS. 14A to 14C shows a geometrical arrangement between the magnetic flux guide layer 1 and the element body, i.e., the multilayer structure portion 6, which can satisfy the above-described conditions and the hard magnetic layer 7 located on both outsides of the multilayer structure portion for applying a stabilizing bias magnetic field to the magnetic flux guide layer 1 and the free layer 2. FIG. 14A is a perspective view and FIGS. 14B and 14C are schematic cross-sectional views taken along the lines B—B and C—C in FIG. 14A.

In FIGS. 14A to 14C, FIG. 14C shows a positional relationship between the hard magnetic layer 7 and the magnetic flux guide layer 1 in the forward surface serving as the introducing surface of the external magnetic field. FIG. 14B shows a positional relationship between the hard magnetic layer 7 and the magnetic flux guide layer 1 in the portion where the multilayer structure portion 6 of the MR element body is located. As these figures show, the hard magnetic layer 7 and the magnetic flux guide layer 1 are formed so as to become flush with each other.

Figure 15A:
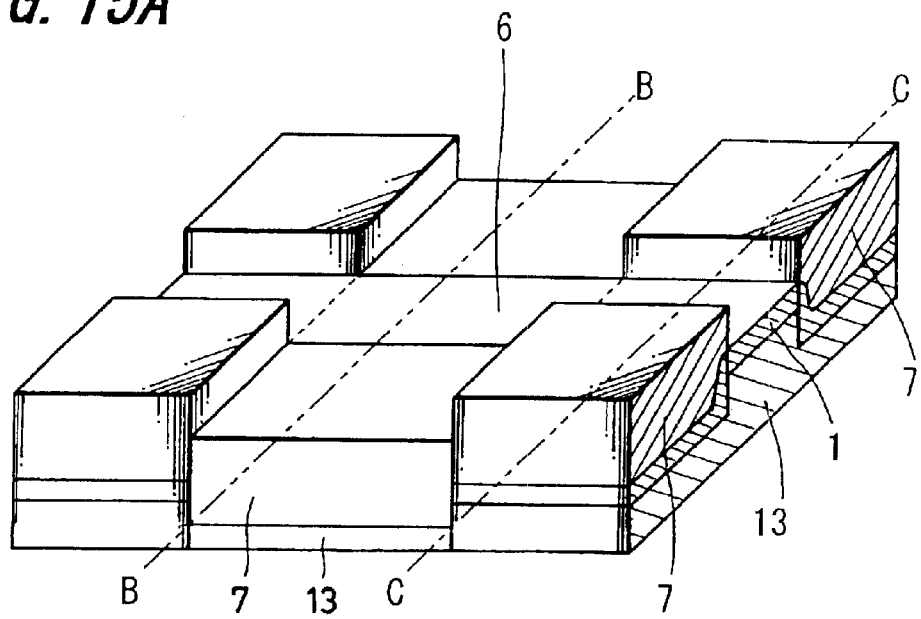
FIGS. 15A, 15B and 15C are a perspective view of a main part of an MR element of a comparative example and a cross-sectional views taken along the line B—B and a cross-sectional view taken along the line C—C, respectively.
Figure 15B:
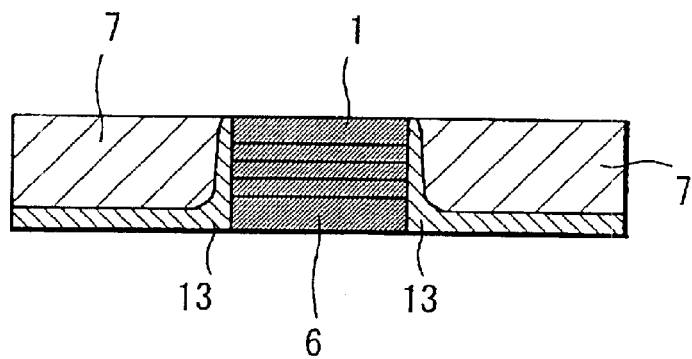
Figure 15C:
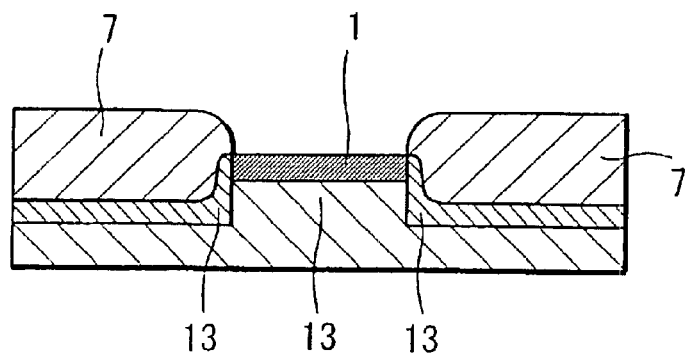

In contrast, if the etch rate of the aforementioned insulating layer 13, e.g., $Al_2O_3$ or the like is considerably low unlike that of the multilayer film of the MR element body as FIG. 15A shows a perspective view and FIGS. 15B and 15C show schematic cross-sectional views taken along the lines B—B and C—C in FIG. 15A, when the magnetic flux guide layer 1 and the hard magnetic layer are flush with each other in FIG. 15B, a stepped or level difference is produced in the multilayer structure portion 6 of the MR element body as shown in FIG. 15C.

Therefore, such structure widens the magnetic gap length in the forward surface 8, so that the element spatial resolution is lowered.

Figure 16A:
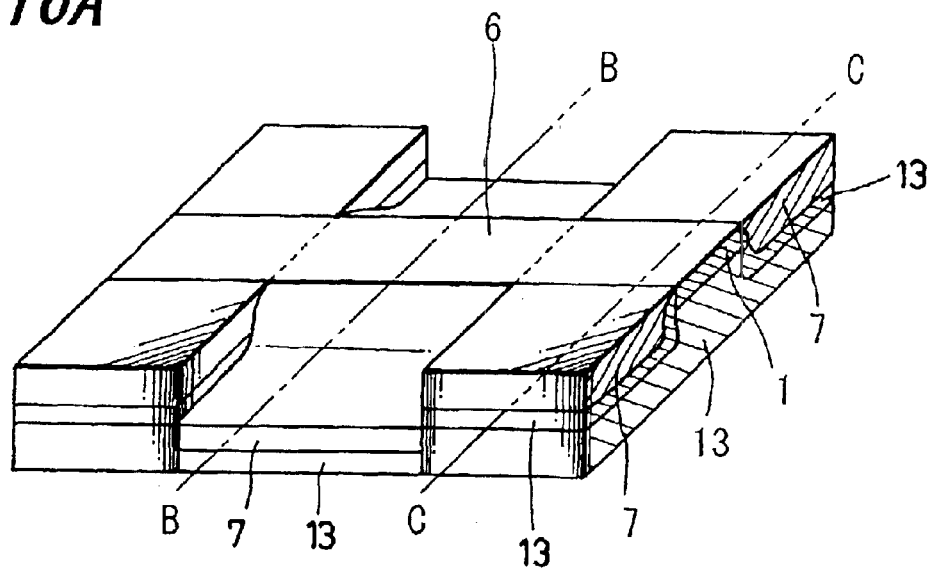
FIGS. 16A, 16B and 16C are a perspective view of a main part of an MR element of a comparative example and a cross-sectional views taken along the line B—B and the line C—C, respectively.
Figure 16B:
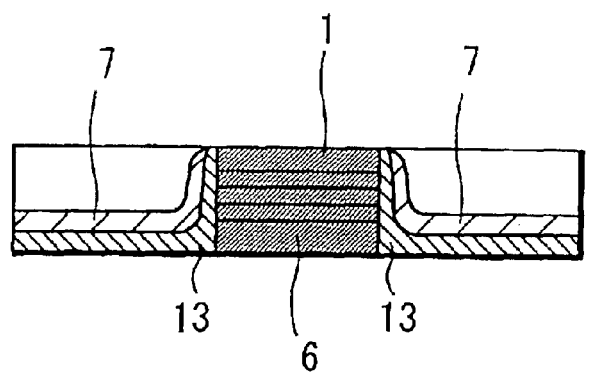
Figure 16C:
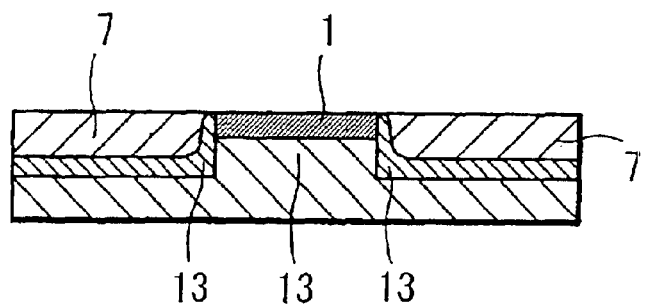

When the hard magnetic layer 7 is made thin, in order to prevent the element spatial resolution from being lowered, as FIG. 16A shows a perspective view and FIGS. 16B and 16C show schematic cross-sectional views taken along the lines B—B and C—C in FIGS. 1A TO 1C6A, the hard magnetic layers 7 cannot be disposed at both outside ends of the multilayer structure portion 6 of the MR element body as shown in FIG. 16B with the result that a stable sufficient response to the external magnetic field cannot be obtained.

In other words, in order to optimize the element spatial resolution and its operation stability, the same stabilizing bias must be applied to the free layer and the magnetic flux guide of the element body. For this purpose, the hard magnetic layer and the magnetic flux guide must be disposed in the same geometrical arrangement.

When the etch rate of the multilayer structure portion 6 formed of the magnetic metal multilayer film is high, to stabilize both of the element portion and the magnetic flux guide, the hard magnetic layer 7 must have an increased thickness as compared with the case of equal etch rates. At that time, the magnetic gap length at the tip, i.e., the front portion of the magnetic flux guide layer 1 which opens on the forward surface and the magnetic gap length at the rear portion of the magnetic flux guide layer, located behind the multilayer structure portion 6 are widened. As a result, the spatial resolution is lowered. When the electrical insulating film for the magnetic flux guide is provided from to avoid the loss in the current path between the upper and lower electrodes through the element portion, because the etch rate of the insulating layer 13 provided on one of or both of the upper and lower sides of the magnetic flux guide layer 1 is selected to be nearly equal to that of the magnetic multilayer film in the multilayer structure portion 6, it is possible to prevent the operation stability and the spatial resolution from being deteriorated.

As described above, according to the manufacturing method of the present invention, the positional relationship among the hard magnetic layer 7, the magnetic flux guide layer 1 and the free layer 2 finally obtained when the etch rates in the second patterning process are made equal to each other can be arranged in a satisfactory layout relationship. Therefore, the desired MR element and MR type magnetic head having the stable and uniform characteristics can be constructed.

Moreover, to improve the spatial resolution of the magnetic flux with respect to the change of time in the shield type structure, it is important that the magnetic gap length defined by the magnetic shields 21 and 22 at the front end of the magnetic flux guide layer 1 or in the forward surface 8 facing the multilayer structure 6 of the element body is kept constant over the whole track width.

As described above, providing the magnetic flux guide layer 1 enables the magnetic field under detection to be detected efficiently as the resistance change. In the manufacturing method according to the present invention, in order to manufacture the magneto-resistive effect element and the magneto-resistive effect type magnetic head including this magnetic flux guide layer there are performed the first patterning for defining the depth length relative to the multilayer film forming the element body and the second patterning in which the insulating layer 13 for burying the portion formed by the first patterning and, the magnetic flux guide layer are formed and the patterning of this magnetic flux guide layer and the definition of the above-mentioned multilayer film are executed at the same time.

In this method, exposure mask matching is performed substantially only once when exposure masks used in the first and second patterning processes are matched with each other. With the above-mentioned arrangement, not only the manufacturing process can be simplified, but also the element body of high accuracy pattern can be formed. In other words, data recorded at a high recording density, e.g. up to 100 Gb/inch$^2$ can be reproduced, thus allowing the yield and reliability of the magneto-resistive effect element and the magneto-resistive effect type magnetic head to be improved.

In this case, portions where the multilayer structure materials are different from each other, in particular, a portion where the insulating layer 13 exits and a portion where the insulating layer does not exist or hardly exists are simultaneously etched in the second patterning and besides, the etch rate of the insulating layer is extremely low in the ordinary method. Thus, a uniform etching is obstructed and the aforementioned disadvantage is inevitably brought about.

However, according to the method of the present invention, the etch rates can be made uniform by selecting the angle in this etching, whereby this problem can be solved.

While the multilayer structure portion 6 forming the MR element body has the bottom type of the SV type of GMR or TMR structure in the above-mentioned example, the present invention is not limited to such example.

Figure 17:
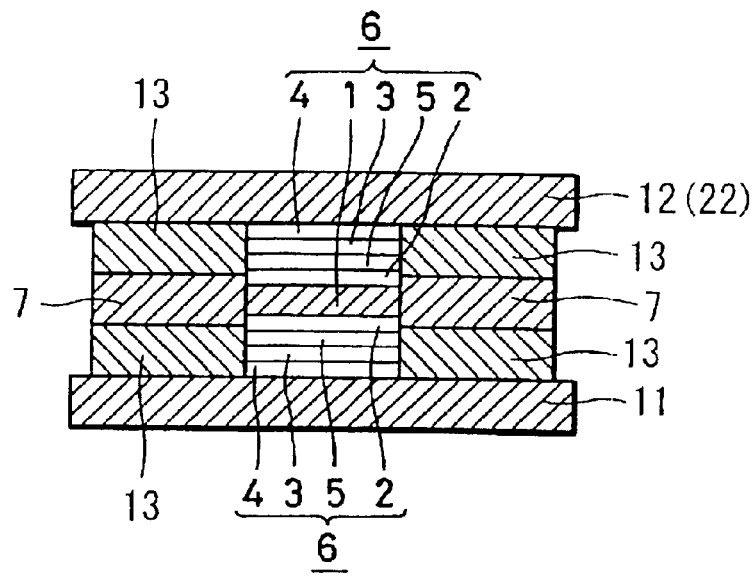
FIG. 17 is a schematic cross-sectional view of an example showing a dual type MR element obtained by a manufacturing method according to the present invention.

In addition, while the multilayer structure portion is formed as a single type of the SV type GMR or TMR structure in the above-mentioned example, the present invention can be formed as a dual type structure in which the free layers 2, the spacer layers 5, the fixed layers 3 and the antiferromagnetic layers 4 are respectively disposed on both surfaces of the magnetic flux guide layers 1 as shown in a schematic cross-sectional view of FIG. 17. In this case, because since the magnetic flux guide layer 1 and the free layers 2 are disposed at the central portion of the magnetic gap and a pair of the SV type GMR elements or TMR elements are disposed, the output of the magne of FIGS. 4A to 4C to resistive effect element can be enhanced.

Furthermore, since the magnetic head H according to the present invention is the magnetic head for reproducing recorded information from the magnetic recording medium, for example, a thin film type of induction type recording magnetic head can be superposed on the magnetic head H as one body to form a recording and reproducing magnetic head.

Figure 18:
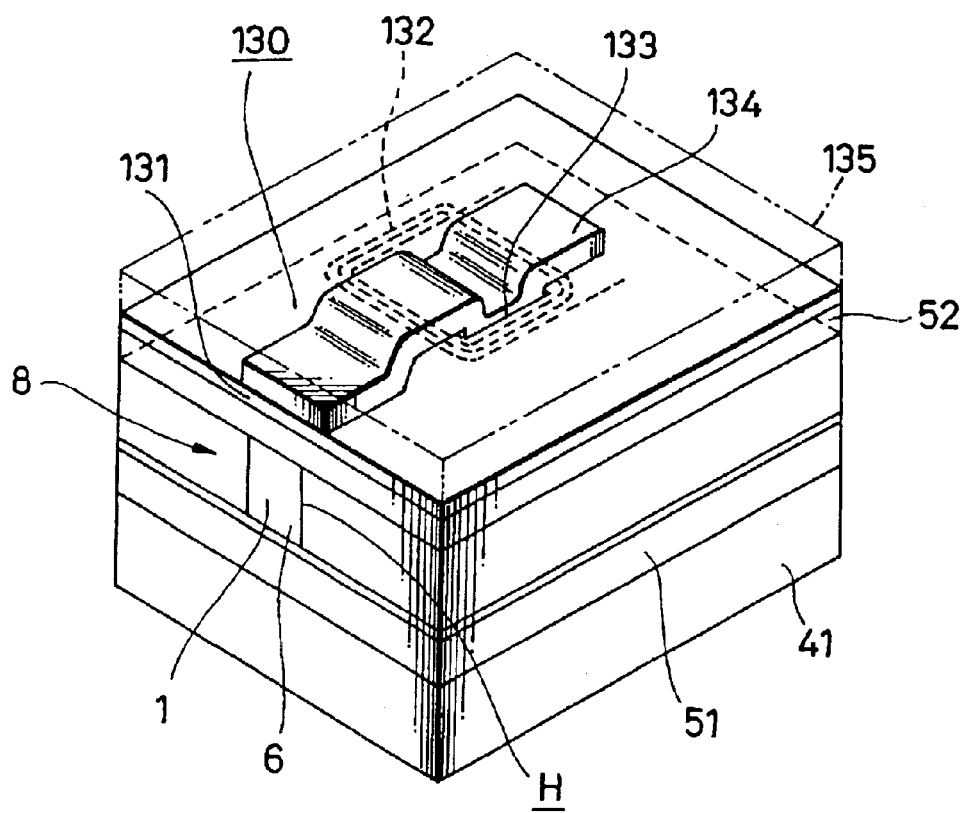
FIG. 18 is a schematic perspective view showing an example of a recording and reproducing magnetic head using an MR type reproducing magnetic head obtained by a manufacturing method according to the present invention.

An example in this case will be described with reference to a perspective view of FIG. 18.

In this example, the magnetic head H manufactured by the above-mentioned manufacturing method according to the present invention is formed between first and second magnetic shield also acting as electrodes 51 and 52 on a substrate 41 and for example, a thin film magnetic recording head 130 of an electromagnetic induction type, is superposed on the second magnetic shield also acting as electrode 52, thereby allowing the above magnetic head to be formed as the magnetic recording and reproducing head.

The recording head 130 has a nonmagnetic layer 131 made of SiO$_2$ and the like forming the magnetic gap at its portion opening on the forward surface 8.

At the rear portion of this recording head, there is formed a coil 132, e.g. by patterning a conductive layer. An insulating layer covers this coil 132. The coil 132 has at its center a through-hole 133 bored through the insulating layer and the nonmagnetic layer 131 to expose the second shield also acting as electrode 52.

On the other hand, a magnetic core layer 134 is formed on the nonmagnetic layer 131, of which the front end opens on the forward surface 8 and which crosses the coil 132 and contacts with the second shield also acting as electrode layer 52 that is exposed through the through-hole 133.

In this manner, there is formed the thin film recording magnetic head 130 of the electromagnetic induction type in which the magnetic gap g, that is defined by a thickness of the nonmagnetic layer 131 is formed between the front end of the magnetic core layer 134 and the second shield also acting as electrode layer 52.

On this magnetic head 130 is formed a protecting layer 135 made of an insulating layer as shown by a dot-and-dash line.

In this way, there can be formed the recording and reproducing magnetic head in which the reproducing magnetic head H of the magneto-resistive effect type according to the present invention and the thin film type recording head 130 are integrated as one body.

Note that the manufacturing method according to the present invention as well as the MR element and the MR type magnetic head obtained by this manufacturing method are not limited to the above-mentioned examples and the present invention can be applied to the manufacturing process of MR elements and MR type magnetic heads having various structures and constructions.

As described above, according to the manufacturing method of the present invention, in the manufacture of a high-output and high-sensitivity magneto-resistive effect element including the magnetic flux guide layer as well as the magnetic head having the magnetic sensing portion formed by that element, the element body including the multilayer structure portion of the SV type GMR structure or TMR structure having the required width and depth and further the magnetic flux guide layer can be formed by the first patterning and the second patterning process for forming the insulating layer and aiming at uniform etch rates by selecting the incident angle of the etching beam. In particular, the positional relationship of the hard magnetic layer relative to the free layer and the magnetic flux guide layer can reliably be set into the predetermined positional relationship advantageously.

Moreover, according to the method of the present invention, the exposure masks are matched substantially only once in the mutual matching of exposure masks used in the first and second patterning processes. With the above-mentioned arrangement, not only the manufacturing process can be simplified, but also the element body of high accuracy pattern can be formed. Thus, data recorded at the high recording density, e.g. up to 100 Gb/inch$^2$ can be reproduced thus allowing, the yield and reliability of the magneto-resistive effect element and the magneto-resistive effect type magnetic head to be improved.

What is claimed is:

1. A method of manufacturing a magneto-resistive effect element including a multilayer structure portion in which there are laminated at least a magnetic flux guide layer, a free layer made of a soft magnetic material of which the magnetization is rotated in response to an external magnetic field or said free layer also acting as said magnetic flux guide layer, a fixed layer made of a ferromagnetic material, an antiferromagnetic layer for fixing the magnetization of said fixed layer and a spacer layer interposed between said free layer and said fixed layer, said method of manufacturing said magneto-resistive effect element comprising:

forming a multi layer film having at least said antiferromagnetic layer, said fixed layer and said spacer layer;

patterning said multilayer film after a predetermined pattern;

filling up a circumference of said patterned multilayer film with an insulating layer;

forming said magnetic flux guide layer or said free layer also acting as said magnetic flux guide layer over said insulating layer and said patterned multilayer film; and simultaneously patterning said magnetic flux guide layer and said multilayer film after a predetermined pattern by beam etching, to form said multilayer structure portion wherein said patterning is executed by such etching that etch rates of materials composing said multilayer structure portion and materials composing said insulating layer are made approximately equal by selecting an incident angle of an etching beam.

2. A method of manufacturing a magneto-resistive effect element according to claim 1, wherein said insulating layer is composed of a silicon oxide film.

3. A method of manufacturing a magneto-resistive effect element according to claim 1, said incident angle of said etching beam is selected so that an angle θ relative to a normal of an etched surface may fall within the range of 10°≦θ≦40°.

4. A method of manufacturing a magneto-resistive effect type magnetic head having a magneto-resistive effect element in which a magnetic sensing portion includes such a multilayer structure portion that there are laminated at least a magnetic flux guide layer, a free layer made of a soft magnetic material of which the magnetization is rotated in response to an external magnetic field or said free layer also acting as said magnetic flux guide layer, a fixed layer made of a ferromagnetic material, an antiferromagnetic layer for fixing the magnetization of said fixed layer and a spacer layer interposed between said free layer and said fixed layer, said method of manufacturing a magneto-resistive effect type magnetic head comprising:

forming a multilayer film having at least said antiferromagnetic layer, said fixed layer and said spacer layer;

patterning said multilayer film after a predetermined pattern;

filling up a circumference of said patterned multilayer film with an insulating layer;

forming said magnetic flux guide layer or said free layer also acting as said magnetic flux guide layer over said insulating layer and said patterned multilayer film; and a simultaneously patterning said magnetic flux guide layer and said multilayer film after a predetermined pattern by beam etching, to form said multilayer structure portion wherein said second patterning is executed by such etching that etch rates of materials composing said multilayer structure portion and of materials composing said insulating layer are made approximately equal by selecting an incident angle of an etching beam.

5. A method of manufacturing a magneto-resistive effect type magnetic head according to claim 4, wherein said insulating layer is composed of a silicon oxide film.

6. A method of manufacturing a magneto-resistive effect type magnetic head according to claim 4, wherein said incident angle of said etching beam is selected so that an angle θ relative to a normal of an etched surface may fall within the range of 10°≦θ≦40°.

* * * * *